US012317750B2

(12) United States Patent
Tan et al.

(10) Patent No.: US 12,317,750 B2
(45) Date of Patent: May 27, 2025

(54) BUCKLING DIELECTRIC ELASTOMER ACTUATOR

(71) Applicant: Nanyang Technological University, Singapore (SG)

(72) Inventors: Wei Ming Matthew Tan, Singapore (SG); Gurunathan Thangavel, Singapore (SG); Pooi See Lee, Singapore (SG)

(73) Assignee: Nanyang Technological University, Singapore (SG)

( * ) Notice: Subject to any disclaimer, the term of this patent is extended or adjusted under 35 U.S.C. 154(b) by 1084 days.

(21) Appl. No.: 17/279,858

(22) PCT Filed: Oct. 9, 2019

(86) PCT No.: PCT/SG2019/050503
§ 371 (c)(1),
(2) Date: Mar. 25, 2021

(87) PCT Pub. No.: WO2020/076238
PCT Pub. Date: Apr. 16, 2020

(65) Prior Publication Data
US 2022/0037581 A1    Feb. 3, 2022

(30) Foreign Application Priority Data
Oct. 9, 2018   (SG) ............... 10201808891V

(51) Int. Cl.
*H01L 41/09*     (2006.01)
*C08F 220/28*    (2006.01)
(Continued)

(52) U.S. Cl.
CPC ....... *H10N 30/206* (2023.02); *C08F 220/285* (2020.02); *C08F 290/067* (2013.01);
(Continued)

(58) Field of Classification Search
CPC .............. C08F 299/065; C08F 220/285; C08F 299/08; H10N 30/206
See application file for complete search history.

(56) References Cited

U.S. PATENT DOCUMENTS

| 2006/0073342 A1 | 4/2006 | Ariga et al. |
| 2009/0197000 A1 | 8/2009 | Limerkens et al. |
| 2017/0333223 A1 | 11/2017 | Rasmussen et al. |

FOREIGN PATENT DOCUMENTS

| CN | 108912287 A | 11/2018 | |
| WO | 2017223424 A1 | 12/2017 | |
| WO | WO 2020/01487 A1 * | 1/2020 | ............ C08F 291/12 |

OTHER PUBLICATIONS

Machine-generated English language translation of WO 2020/014871 A1, published Jan. 23, 2020 (11 pages); retrieved from Espacenet on Jul. 9, 2024 (Year: 2020).*

(Continued)

*Primary Examiner* — Fred M Teskin
(74) *Attorney, Agent, or Firm* — Patterson + Sheridan, LLP

(57) ABSTRACT

Disclosed herein is a buckling actuator, comprising: a first electrode; a second electrode; and a film of a dielectric elastomeric material having a first surface and a second surface sandwiched between the first and second electrodes, wherein the material is formed by the random block copolymerisation of a polymeric material comprising silicon or nitrogen atoms that has two or more acrylate or vinyl end groups, and a polar polymeric material having two or more acrylate or vinyl end groups. Also disclosed herein is a method of forming said dielectric elastomeric material.

20 Claims, 18 Drawing Sheets

(51) Int. Cl.
C08F 290/06 (2006.01)
H01L 41/193 (2006.01)
H01L 41/45 (2013.01)
H10N 30/098 (2023.01)
H10N 30/20 (2023.01)
H10N 30/857 (2023.01)
H10N 39/00 (2023.01)

(52) U.S. Cl.
CPC ......... *H10N 30/098* (2023.02); *H10N 30/857* (2023.02); *H10N 39/00* (2023.02)

(56) References Cited

OTHER PUBLICATIONS

Carpi et al.; Standards for dielectric elastomer transducers. Smart Mater. Struct. 24, 105025 (2015).
Ren, et al.; Phase-changing bistable electroactive polymer exhibiting sharp rigid-to-rubbery transition. Macromolecules 49, 134-140, (2015).
Renard et al.; Plasticized thermoplastic polyurethanes for dielectric elastomers with improved electromechanical actuation. Appl. Polym. Sci. 134, 45123 (2017).
Chen et al.; Copper phthalocyanine oligomer noncovalent functionalized graphene-polyurethane dielectric elastomer composites for flexible micro-actuator. Soft Mater. 13, 210-218 (2015).
Ha et al.; High electromechanical performance of electroelastomers based on interpenetrating polymer networks. Proc. SPIE 2008 6927, 69272C (2008).
Zhao et al.; Temperature-dependent electro-mechanical actuation sensitivity in stiffness-tunable BaTiO3/polydimethylsiloxane dielectric elastomer nanocomposites. Appl. Phys. Lett., 106, 092904 (2015).
Sheng et al; Thermal, mechanical, and dielectric properties of a dielectric elastomer for actuator applications. J Macromol Sci B, 51, 2093-2104 (2012).
Lei et al.; "Experimental study on the dynamic response of in-plane deformation of dielectric elastomer under alternating electric load." Smart Mater. Struct., vol. 23, No. 2 pp. 025037, Jan. 2014.
Vertechy, et al.; "Modeling and experimental validation of buckling dielectric elastomer actuators," Smart Mater. Struct., vol. 21, No. 9, pp. 094005, Aug. 2012.
Zhang et al.; Preparation and properties of core-shell structured calcium copper titanate@polyaniline/silicone dielectric elastomer actuators. Polym. Compos., 40, E62-E68 (2019).
Zhang et al.; Highly improved electro-actuation of dielectric elastomers by molecular grafting of azobenzenes to silicon rubber. J. Mater. Chem. C 3, 4883-4889 (2015).
Sun et al. Simultaneously improved dielectric and mechanical properties of silicone elastomer by designing a dual crosslinking network. Polym. Chem., 10, 633-645 (2019).
Zhao et al.; Remarkable electrically actuation performance in advanced acrylic-based dielectric elastomers without pre-strain at very low driving electric field. Polymer 137, 269-275 (2018).
Shankar et al.; Electromechanical response of nanostructured polymer systems with no mechanical pre-strain. Macromol. Rapid Commun. 28, 1142-1147 (2007).
Renard et al.; Remarkably improved electromechanical actuation of polyurethane enabled by blending with silicone rubber. RSC Adv., 7, 22900-22908 (2017).
Xiang et al.; Optimization of mechanical and dielectric properties of poly (urethane-urea)-based dielectric elastomers via the control of microstructure. RSC Adv., 7, 55610-55619 (2017).
Guo et al., Prestrain-free electrostrictive film sandwiched by asymmetric electrodes for out-of-plane actuationl Chem. Eng. J. 2018, 352, 876-885.
Basdogan et al; "Haptics in minimally invasive surgical simulation and training," IEEE Comput. Graph. Appl., vol. 24, No. 2, pp. 56-64, Mar. 2004.

Tindale et al.; "Wearable haptic gaming using vibrotactile arrays," in Proceedings 16th international conference on Human-computer interaction with mobile devices & services, Toronto, ON, Canada, 2014, pp. 435-438.
Park et al.; "Ultrahigh strain and piezoelectric behavior in relaxor based ferroelectric single crystals," J. Appl. Phys, vol. 82, No. 4, pp. 1804-1811, May 1997.
Velazquez et al.; "A low-cost highly-portable tactile display based on shape memory alloy micro-actuators," in . Proceedings of the 2005 IEEE International Conference on Virtual Environments, Human-Computer Interfaces and Measurement Systems, VECIMS 2005, Messina, ME, Italy, 2005, pp. 121-126.
Mazzone et al.; "Novel actuators for haptic displays based on electroactive polymers." in Proceedings ACM symposium on Virtual reality software and technology, Osaka, QKV, Japan, 2003, pp. 196-204.
Bar-Cohen et al.; "Electroactive polymer actuators and sensors," MRS Bull., vol. 33, No. 3, pp. 173-181, Mar. 2008.
Romasanta et al.; "Increasing the performance of dielectric elastomer actuators: A review from the materials perspective," Prog. Polym. Sci., vol. 51, pp. 188-211, Dec. 2015.
Ha et al.; "Interpenetrating polymer networks for high-performance electroelastomer artificial muscles," Adv. Mater., vol. 18, pp. 887-891, Mar. 2006.
Duduta et al.; "Multilayer dielectric elastomers for fast, programmable actuation without prestretch." Adv. Mater., vol. 28, No. 36, pp. 8058-8063, Jul. 2016.
Yun et al; "Polymer-based flexible visuo-haptic display". IEEE/ASME Trans. Mechatronics, vol. 19, No. 4, pp. 1463-1469, Aug. 2014.
Racles, et al.; "Synthesis and characterization of silicones containing cyanopropyl groups and their use in dielectric elastomer actuators," Smart Mater. Struct., vol. 22, No. 10, pp. 104004, Sep. 2013.
Yao et al.; "Largely improved electromechanical properties of thermoplastic polyurethane dielectric elastomer by carbon nanospheres," RSC Adv., vol. 5, No. 30, pp. 23719-23726, Feb. 2015.
Pelrine et al.; "Electrostriction of polymer dielectrics with compliant electrodes as a means of actuation." Sens. Actuators A Phys., vol. 64, No. 1, pp. 77-85, Jan. 1998.
Shian et al.; "Highly compliant transparent electrodes," Appl. Phys. Lett., vol. 101, No. 6, pp. 061101, Aug. 2012.
Biggs et al.; "Electroactive polymers: developments of and perspectives for dielectric elastomers." Angew. Chem. Int. Ed., vol. 52, No. 36, pp. 9409-9421, Jul. 2013.
Vishniakou et al., "Tactile feedback display with spatial and temporal resolutions," Sci. Rep., vol. 3, No. 2521, Aug. 2013.
Zhang et al.; "Effects of crosslinking, prestrain, and dielectric filler on the electromechanical response of a new silicone and comparison with acrylic elastomer," in Proceedings vol. 5385, Smart Structures and Materials 2004: Electroactive Polymer Actuators and Devices (EAPAD), San Diego, CA, USA, 2004, pp. 78-86.
Bense et al.; "Buckling of elastomer sheets under non-uniform electro-actuation." Soft matter, vol. 13, No. 15, pp. 2876-2885, Mar. 2017.
Yuan et al.; "Cross-linking effect on dielectric properties of polypropylene thin films and applications in electric energy storage." Appl. Phys. Lett., vol. 98, No. 6, pp. 062901, Feb. 2011.
Artbauer, "Electric strength of polymers." J. Phys. D: Appl. Phys., vol. 29, pp. 446-456, Feb. 1996.
Yang et al.; "New polyester dielectric elastomer with large actuated strain at low electric field." Mater. Lett., vol. 76, pp. 229-232, Feb. 2012.
Hu et al.; "An aluminum nanoparticle-acrylate copolymer nanocomposite as a dielectric elastomer with a high dielectric constant," J. Mater. Chem. C, vol. 2, No. 9, pp. 1658-1666, Mar. 2014.
Rosset et al.; Large stroke miniaturized dielectric elastomer actuators, Solid-State Sensors, Actuators and Microsystems (2009).
Niu et al.; Bistable electroactive polymer for refreshable Braille display with improved actuation stability, Electroactive Polymer Actuators and Devices (2012).

(56) References Cited

OTHER PUBLICATIONS

Rosset et al.; Large-stroke dielectric elastomer actuators with ion-implanted electrodes. J. Microelectromech. Syst. 18, 1300-1308 (2009).
Pelrine et al.; High?Strain Actuator Materials Based on Dielectric Elastomers. Adv. Mater. 12, 1223-1225 (2000).
Pelrine et al.; High-field deformation of elastomeric dielectrics for actuators. Mater. Sci. Eng. C 11, 89-100 (2000).
Pelrine et al.; High-Speed Electrically Actuated Elastomers with Strain Greater Than 100%. Science 287, 836-839 (2000).
Kofod et al.; Actuation response of polyacrylate dielectric elastomers. J. Intell. Mater. Syst. Struct. 14, 787-793 (2003).
Zhang et al.; G. Effects of crosslinking, prestrain, and dielectric filler on the electromechanical response of a new silicone and comparison with acrylic elastomer. Proc. SPIE, 5385, 78-86 (2004).
Zhao et al.; Nonequilibrium thermodynamics of dielectric elastomers. Int. J. Appl. Mech. 3, 203-217 (2011).
Foo et al.; Model of dissipative dielectric elastomers. J. Appl. Phys., 111, 034102 (2012).
Zou et al.; Modeling the Viscoelastic Hysteresis of Dielectric Elastomer Actuators with a Modified Rate-Dependent Prandtl-Ishlinskii Model. Polymers 10, 525 (2018).
Hamid, Z. A. A. et al., Evaluation of UV-crosslinked poly(ethylene glycol) diacrylate/poly(dimethylsiloxane) dimethacrylate hydrogel: properties for tissue engineering application. 5th International Conference on RAMM & 2nd International Postgraduate Conference on MAMIP, Aug. 4, 2016, vol. 19, pp. 410-418 [Retrieved on Dec. 9, 2019] <DOI: 0.1016/J.PROCHE.2016.03.032> Abstract.
Jun, K. et al., Surface modification of anisotropic dielectric elastomer actuators with uni- and bi-axially wrinkled carbon electrodes for wettability control. Scientific Reports, Jul. 20, 2017, vol. 7, No. 6091 [Retrieved on Dec. 9, 2019] <DOI: 10.1038/S41598-017-06274-0> Abstract; Figure 1.
Ren, Z. et al., Phase-changing bistable electroactive polymer exhibiting sharp rigid-to-rubbery transition. Macromolecules, Dec. 29, 2015, vol. 49, No. 1, pp. 134-140 [Retrieved on Dec. 9, 2019] <DOI: 10.1021 /ACS.MACROMOL.5B02382> the whole document.
Huang et al.; Influence of BaTiO 3 nanoparticles on dielectric, thermophysical and mechanical properties of ethylene-vinyl acetate elastomer/BaTiO3 microcomposites. IEEE Trans. Dielectr. Electr. Insul. 18, 375-383 (2011).
Yang et al.; Improved electromechanical properties of silicone dielectric elastomer composites by tuning molecular flexibility. Compos. Sci. Technol. 155, 160-168 (2018).
Hu et al.; An aluminum nanoparticle-acrylate copolymer nanocomposite as a dielectric elastomer with a high dielectric constant. J. Mater. Chem. C 2, 1658-1666 (2014).

Poikelispää et al.; Improvement of actuation performance of dielectric elastomers by barium titanate and carbon black fillers. J. Appl. Polym. Sci. 133, 44116, (2016).
Kim et al.; Effect of chlorine-containing polymer additive on dielectric performance of polymer dielectric films. Electron. Lett. 50, 357-358 (2014).
Liu et al.; Experimental study on the dynamic response of in-plane deformation of dielectric elastomer under alternating electric load. Smart Mater. Struct. 23, 025037 (2014).
Tran et al.; Viscoelastic effects on the actuation performance of a dielectric elastomer actuator under different equal, un-equal biaxial pre-stretches. Mater. Res. Express, 5, 065303 (2018).
Jiang et al.; Electromechanical instability in silicone?and acrylate?based dielectric elastomers. J. Appl. Polym. Sci. 135, 45733 (2018).
Kanyanta et al.; Mechanical characterisation of polyurethane elastomer for biomedical applications. J. Mech. Behav. Biomed. Mater. 3, 51-62 (2010).
Sahu et al.; Stress-Strain Behaviour of Dielectric Elastomer for Actuators. Appl. Mech. Mater. 789, 837 (2015).
Johnston et al.; Mechanical characterization of bulk Sylgard 184 for microfluidics and microengineering. J. Micro-mech. Microeng. 24, 035017 (2014).
Martinez et al.; Soft actuators and robots that are resistant to mechanical damage. Adv. Funct. Mater. 24, 3003-3010 (2014).
Diani et al.; review on the Mullins effect. Eur. Polym. J. 45, 601-612 (2009).
Zhao et al.; Theory of dielectric elastomers capable of giant deformation of actuation. Phys. Rev. Lett. 104, 178302 (2010).
Michel et al.; comparison between silicone and acrylic elastomers as dielectric materials in electroactive polymer actuators. Polym Int. 59, 391-399 (2010).
Madsen et al.; 2016. The current state of silicone?based dielectric elastomer transducers. Macromolecular rapid communications, 37(5), pp. 378-413.
Ellingford et al.; 2018. Intrinsically tuning the electromechanical properties of elastomeric dielectrics: a chemistry perspective. Macromolecular rapid communications, 39(18), p. 1800340.
Akther et al.; 2019. Miniaturised acoustofluidic tactile haptic actuator. Soft matter.
Hollins et al.; 2002. Vibrotaction and texture perception. Behavioural brain research, 135(1-2), pp. 51-56.
Niu, et al.; "Synthesizing a new dielectric elastomer exhibiting large actuation strain and suppressed electromechanical instability without prestretching." J. Polym. Sci. B, vol. 51, No. 3, pp. 197-206, Feb. 2013.
Niu et al.; Proc. SPIE, 2013, 8687.
Ha et al.; "Interpenetrating networks of elastomers exhibiting 300% electrically-induced area strain." Smart Mater. Struct., vol. 16, No. 2, pp. S280, Mar. 2007.

\* cited by examiner (a)

PUA (CN9021)

(b)

PEGDA

BUCKLING DIELECTRIC ELASTOMER ACTUATOR

FIELD OF INVENTION

This invention relates to a buckling dielectric elastomer actuator comprising a film of dielectric elastomeric material, the dielectric elastomeric material and the method of forming said dielectric elastomer material.

BACKGROUND

The listing or discussion of a prior-published document in this specification should not necessarily be taken as an acknowledgement that the document is part of the state of the art or is common general knowledge.

The sense of touch is critically involved in any physical interaction that we encounter in our daily lives. However, when interacting with a virtual environment, this sense of touch is often deficient. Fortunately, with haptic technology, the sense of touch can be recreated for human-computer or human-machine interactions, via the use of haptic devices such as actuators to recreate forces that stimulate a desired sensation on the skin. With the inclusion of haptic technology into our lives, applications such as enhanced surgical training, video gaming and braille display for the blind are now becoming a reality.

Currently, materials such as piezoelectric ceramics, shape memory alloys and electroactive polymers have been applied as actuators for haptic feedback devices. However, the actuation strains achieved by piezoelectric ceramics are usually less than 1%, while the actuation from shape memory alloys is hard to control due to its non-linear thermomechanical properties. As such, electroactive polymers (EAPs) remain as the preferred material for haptics due to their low power consumption, lightweight, low cost and high actuation strains. EAPs are a class of materials that can exhibit a change in size and shape when an electric field is being applied.

Within this category of materials, dielectric elastomers (DE) are one of the preferred choices for haptic devices due to its fast actuation response, quiet operation and long-term performance at room temperature. In addition, dielectric elastomers (DE) possess low elastic modulus, high strain capabilities, and superior resilience allowing them to be used in a variety of applications.

A dielectric elastomer is an example of an EAP. Commonly-used DE materials include the acrylic-based adhesive films from 3M (known as the VHB series). These VHB polymers have superior properties, including the ability to achieve elongations of over 600%, and area actuation strains of up to 380%. However, these materials exhibit slow response and recovery times, typically of several hundred seconds, due to their highly viscoelastic nature. In addition, as a dissipative process, viscoelastic hysteresis has been shown to exert an adverse effect on performance and cause positioning inaccuracy. As such, materials with low viscoelasticity, such as silicone rubber, are often used to replace VHB polymers. However, these materials often exhibit a low dielectric constant ($\approx 2.8$), which is insufficient to achieve high strains in dielectric elastomer actuators. Alternatively, DEs can be pre-stretched to reduce the effects of viscoelasticity. Some studies have shown that pre-stretching provides benefits such as a shorter relaxation time, reduced drifting effects and higher electromechanical strain. However, the pre-stretched state is often achieved by mounting the DE film on a rigid frame, which increases the weight of the actuator and limits the integration of such actuators into soft and flexible bodies. Additionally, pre-stretching reduces the lifetime of the device due to stress relaxation and fatigue.

A common actuator type for haptic and refreshable braille displays are buckling mode actuators. These actuators display an out-of-plane deflection when a voltage is applied across the DE. However, to induce this mode of actuation the DE has to be constrained by rigid boundaries, such as a rigid ring or frame to prevent area expansion. Furthermore, it has been reported that to achieve a unidirectional buckling, a pre-curvature is required on the inactive DE, which can be achieved through air pressure or a geometric support. However, the addition of such components/shaping forces may limit the integration of buckling actuators into soft and flexible haptic devices.

Given the above, there remains a need to develop new materials or actuators to solve one or more of the above-mentioned problems. More importantly, such materials or actuators need to have excellent dielectric and mechanical properties, and are able to tolerate repeated use. In addition, they have to be highly stable, but yet versatile, so that they can be integrated easily onto wearable technology for different applications.

SUMMARY OF INVENTION

Aspects and embodiments of the invention will be described by reference to the following numbered clauses.

1. A buckling actuator, comprising:
   a first electrode;
   a second electrode; and
   a film of a dielectric elastomeric material having a first surface and a second surface sandwiched between the first and second electrodes, the material formed by the random block copolymerisation of:
      a polymeric material comprising silicon or nitrogen atoms that has two or more acrylate or vinyl end groups; and
      a polar polymeric material having two or more acrylate or vinyl end groups
   wherein:
   the first electrode is arranged to cover a first electrode area on the first surface of the film of dielectric elastomeric material and the second electrode is arranged to cover a second electrode area on the second surface of the film of dielectric elastomeric material, such that there is a region of overlap between the first and second electrode areas that has an area that is smaller than an area of the first or second surfaces of the film of dielectric elastomeric material.

2. The actuator according to claim 1, wherein the first and second electrode areas each occupies an area of from 5% to 50%, such as from 10 to 40%, such as from 15 to 30% on the first and second surfaces of the film of dielectric elastomeric material, respectively.

3. The actuator according to Clause 1 or Clause 2, wherein:
   (a) the polymeric material comprising silicon or nitrogen atoms that has two or more acrylate or vinyl end groups has two acrylate end groups; and/or
   (b) the polar polymeric material having two or more acrylate or vinyl end groups has two acrylate end groups.

4. The actuator according to any one of the preceding clauses, wherein the polymeric material comprising silicon or nitrogen atoms that has two or more acrylate or vinyl end groups is selected from one or more of a urethane acrylate polymeric material that has two acrylate end groups, a poly(dimethylsiloxane) dimethacrylate, and a thermoplastic polyurethane that has two acrylate end groups.

5. The actuator according to Clause 4, wherein the urethane acrylate polymeric material that has two acrylate end groups is an aliphatic acrylate polymeric material that has two acrylate end groups, optionally wherein the aliphatic acrylate polymeric material that has two acrylate end groups is selected from one or more of CN310, CN8881, CN8884, CN8888, CN9004, CN9014, CN9028, CN9031, CN9002, CN966J75, CN9018, CN9021, CN3108, CN3211 and CN8004, optionally wherein the urethane acrylate polymeric material that has two acrylate end groups is CN9021.

6. The actuator according to any one of the preceding clauses, wherein the polymeric material comprising silicon or nitrogen atoms that has two or more acrylate or vinyl end groups has a number average molecular weight of greater than 20,000 Daltons, such as from 20,001 to 50,000 Daltons.

7. The actuator according to any one of the preceding clauses, wherein the polar polymeric material having two or more acrylate or vinyl end groups is selected from one or more of poly(ethyleneglycol) diacrylate (PEGDA), poly(caprolactone) dimethacrylate and poly(propylene glycol) dimethacrylate.

8. The actuator according to Clause 7, wherein the polar polymeric material having two or more acrylate or vinyl end groups is poly(ethyleneglycol) diacrylate (PEGDA).

9. The actuator according to any one of the preceding clauses, wherein the polar polymeric material having two or more acrylate or vinyl end groups has a number average molecular weight of from 200 to 1,000 Daltons.

10. The actuator according to Clause 9, wherein the polar polymeric material having two or more acrylate or vinyl end groups has a number average molecular weight of from 250 to 750 Daltons, such as from 400 to 600 Daltons, such as 575 Daltons.

11. The actuator according to any one of the preceding clauses, wherein the polar polymeric material having two or more acrylate or vinyl end groups is present in the dielectric elastomeric material in an amount of from 5 to 15 wt %, such as 10 to 15 wt %.

12. The actuator according to any one of the preceding clauses, wherein:
(aa) the dielectric elastomeric material has a dielectric constant ($\varepsilon_r$) of greater than 3, such as from 3.1 to 100, such as from 5.8 to 20, such as from 6 to 15, such as from 6.2 to 9.4; and/or
(ab) the dielectric elastomeric material has an elastic modulus of from 0.1 to 4 MPa, such as from 0.3 to 4 MPa; and/or
(ac) the buckling actuator has a displacement upon supply of a voltage to the first and second electrodes of less than or equal to 1,250 μm, such as from 100 to 1,250 μm, such as from 500 to 1,250 μm, such as from 250 to 750 μm, such as from 1,000 to 1,250 μm; and/or (ad) the dielectric elastomeric material has a dielectric breakdown of less than or equal to 30 V/μm, such as from 10 V/μm to 25 V/μm, such as from 8 V/μm to 25 V/μm, such as from 10 V/μm to 20 V/μm; and/or
(ae) the dielectric elastomeric material has an elongation to break of greater than 50%, such as from 50 to 960%, such as from 50 to 500%, such as 150 to 450%, such as 423%.

13. The actuator according to any one of the preceding clauses, wherein the actuator further comprises a flexible substrate, where the second electrode is placed on the flexible substrate and the film of dielectric elastomeric material is formed on top of at least part of the second electrode and flexible substrate.

14. The actuator according to any one of the preceding clauses, wherein the actuator does not include rigid constraint members, optionally wherein the actuator is capable of producing out-of-plane actuation without rigid constrain members being present when a voltage is applied.

15. The actuator according to any one of the preceding clauses, wherein the first and second electrodes are independently selected from carbon grease, one or more metal nanowires, hydrogels, ionogels, carbon nanotubes and liquid metal, optionally wherein first and second electrodes are formed from silver nanowires.

16. The actuator according to any one of the preceding clauses, wherein the actuator is transparent.

17. A dielectric elastomeric material formed by the random block copolymerisation of:
a polymeric material comprising silicon or nitrogen atoms that has two or more acrylate or vinyl end groups; and
a polar polymeric material having two or more acrylate or vinyl end groups.

18. The dielectric elastomeric material according to Clause 17, wherein:
(ai) the polymeric material comprising silicon or nitrogen atoms that has two or more acrylate or vinyl end groups has two acrylate end groups; and/or
(bii) the polar polymeric material having two or more acrylate or vinyl end groups has two acrylate end groups.

19. The dielectric elastomeric material according to Clause 17 or Clause 18, wherein the polymeric material comprising silicon or nitrogen atoms that has two or more acrylate or vinyl end groups is selected from one or more of a urethane acrylate polymeric material that has two acrylate end groups, a poly(dimethylsiloxane) dimethacrylate and a thermoplastic polyurethane that has two acrylate end groups.

20. The dielectric elastomeric material according to Clause 19, wherein the urethane acrylate polymeric material that has two acrylate end groups is an aliphatic acrylate polymeric material that has two acrylate end groups, optionally wherein the aliphatic acrylate polymeric material that has two acrylate end groups is selected from one or more of CN310, CN8881, CN8884, CN8888, CN9004, CN9014, CN9028, CN9031, CN9002, CN966J75, CN9018, CN9021, CN3108, CN3211 and CN8004, optionally wherein the urethane acrylate polymeric material that has two acrylate end groups is CN9021.

21. The dielectric elastomeric material according to any one of Clauses 17 to 20, wherein the polymeric material comprising silicon or nitrogen atoms that has two or more acrylate or vinyl end groups has a number average molecular weight of greater than 20,000 Daltons, such as from 20,001 to 50,000 Daltons.

22. The dielectric elastomeric material according to any one of Clauses 17 to 21, wherein the polar polymeric material having two or more acrylate or vinyl end groups is selected from one or more of poly(ethyleneglycol) diacrylate (PEGDA), poly(caprolactone) dimethacrylate and poly(propylene glycol) dimethacrylate.

23. The dielectric elastomeric material according to Clause 22, wherein the polar polymeric material having two or more acrylate or vinyl end groups is poly(ethyleneglycol) diacrylate (PEGDA).

24. The dielectric elastomeric material according to any one of Clauses 17 to 23, wherein the polar polymeric material having two or more acrylate or vinyl end groups has a number average molecular weight of from 200 to 1,000 Daltons.

25. The dielectric elastomeric material according to Clause 24, wherein the polar polymeric material having two or more acrylate or vinyl end groups has a number average molecular weight of from 250 to 750 Daltons, such as from 400 to 600 Daltons, such as 575 Daltons.

26. The dielectric elastomeric material according to any one of Clauses 17 to 25, wherein the polar polymeric material having two or more acrylate or vinyl end groups is present in the dielectric elastomeric material in an amount of from 5 to 15 wt %, such as 10 to 15 wt %.

27. The dielectric elastomeric material according to any one of Clauses 17 to 26, wherein:
(Aa) the dielectric elastomeric material has a dielectric constant ($\varepsilon_r$) of greater than 3, such as from 3.1 to 100, such as from 5.8 to 20, such as from 6 to 15, such as from 6.2 to 9.4; and/or
(Ab) the dielectric elastomeric material has an elastic modulus of from 0.1 to 4 MPa, such as from 0.3 to 4 MPa; and/or
(Ac) the dielectric elastomeric material is provided in the form of a film; and/or
(Ad) the dielectric elastomeric material has a dielectric breakdown of less than or equal to 30 V/$\mu$m, such as from 10 V/$\mu$m to 25 V/$\mu$m, such as from 8 V/$\mu$m to 25 V/$\mu$m, such as from 10 V/$\mu$m to 20 V/$\mu$m; and/or
(Ae) the dielectric elastomeric material has an elongation to break of greater than 50%, such as from 50 to 960%, such as from 50 to 500%, such as 150 to 450%, such as 423%.

28. A method of forming a dielectric elastomeric material as described in any one of Clauses 17 to 27, the method comprising the steps of:
(i) providing a mixture comprising a polymeric material comprising silicon or nitrogen atoms that has two or more acrylate or vinyl end groups with a polar polymeric material having two or more acrylate or vinyl end groups in the presence of a radical initiator and optionally in the presence of a solvent; and
(ii) reacting the mixture for a period of time at an elevated temperature to provide the dielectric elastomeric material.

29. The method according to Clause 28, wherein:
(ia) the polymeric material comprising silicon or nitrogen atoms that has two or more acrylate or vinyl end groups has two acrylate end groups; and/or
(ib) the polar polymeric material having two or more acrylate or vinyl end groups has two acrylate end groups.

30. The method according to Clause 28 or Clause 29, wherein the polymeric material comprising silicon or nitrogen atoms that has two or more acrylate or vinyl end groups is selected from one or more of a urethane acrylate polymeric material that has two acrylate end groups, a poly(dimethylsiloxane) dimethacrylate, and a thermoplastic polyurethane that has two acrylate end groups.

31. The method according to Clause 30, wherein the urethane acrylate polymeric material that has two acrylate end groups is an aliphatic acrylate polymeric material that has two acrylate end groups, optionally wherein the aliphatic acrylate polymeric material that has two acrylate end groups is selected from one or more of CN310, CN8881, CN8884, CN8888, CN9004, CN9014, CN9028, CN9031, CN9002, CN966J75, CN9018, CN9021, CN3108, CN3211 and CN8004, optionally wherein the urethane acrylate polymeric material that has two acrylate end groups is CN9021.

32. The method according to any one of Clauses 28 to 31, wherein the polymeric material comprising silicon or nitrogen atoms that has two or more acrylate or vinyl end groups has a number average molecular weight of greater than 20,000 Daltons, such as from 20,001 to 50,000 Daltons.

33. The method according to any one of Clauses 28 to 32, wherein the polar polymeric material having two or more acrylate or vinyl end groups is selected from one or more of poly(ethyleneglycol) diacrylate (PEGDA), poly(caprolactone) dimethacrylate and poly(propylene glycol) dimethacrylate.

34. The method according to Clause 33, wherein the polar polymeric material having two or more acrylate end groups is poly(ethyleneglycol) diacrylate (PEGDA).

35. The method according to any one of Clauses 28 to 34, wherein the polar polymeric material having two or more acrylate or vinyl end groups has a number average molecular weight of from 200 to 1,000 Daltons.

36. The method according to Clause 35, wherein the polar polymeric material having two or more acrylate or vinyl end groups has a number average molecular weight of from 250 to 750 Daltons, such as from 400 to 600 Daltons, such as 575 Daltons.

37. The method according to any one of Clauses 28 to 36, wherein the polar polymeric material having two or more acrylate or vinyl end groups is present in the dielectric elastomeric material in an amount of from 5 to 15 wt %, such as 10 to 15 wt %.

38. The method according to any one of Clauses 28 to 37, wherein the dielectric elastomeric material is provided in the form of a film following completion of step (ii) of Clause 28.

39. The method according to any one of Clauses 28 to 38, wherein the mixture of step (i) of Clause 28 further comprises a solvent, where the solvent and the polymeric material comprising silicon or nitrogen atoms that has two or more acrylate or vinyl end groups have a weight to weight ratio of from 10:1 to 1:1, such as from 3:1 to 1:1, optionally wherein the solvent is acetone and/or isopropyl alcohol.

40. The method according to any one of Clauses 28 to 39, wherein:
(A) the elevated temperature in step (ii) of Clause 28 is from 50 to 100° C., such as from 70 to 90° C.;
(B) the radical initiator is present in an amount of at least 1 wt % (e.g. from 1 wt % to 10 wt %, such as from 1 wt % to of the mixture;
(C) the period of time for the reaction in step (ii) of Clause 28 is from 10 minutes to 24 hours, such as from 15 minutes to 12 hours, such as 20 minutes to 1 hour, such as 30 minutes.

41. An array of buckling actuators comprising a plurality of buckling actuators as described in any one of Clauses 1 to 16.

42. The array of buckling actuators according to Clause 41, wherein the array of buckling actuators are arranged in a cross-junction configuration.

DESCRIPTION

Figure 1:
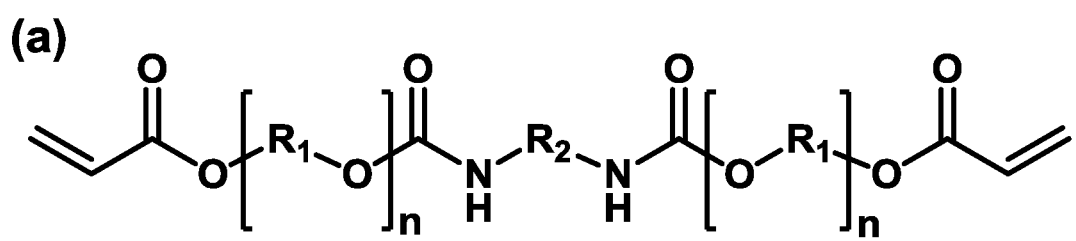
FIG. 1 Depicts: (a and b) the molecular structures of polyurethane acrylate (PUA, CN9021) and polyethylene glycol diacrylate (PEGDA), respectively, used for synthesising a copolymer film of the current invention.
Figure 1:
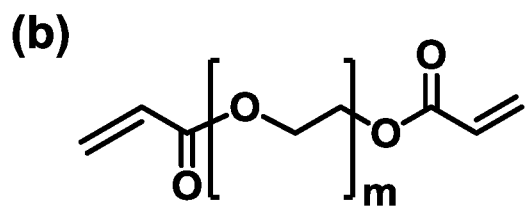

It has been surprisingly found that random block copolymerisation of a polymeric material comprising silicon or nitrogen atoms that has two or more acrylate or vinyl end groups (e.g. polyurethane acrylate) with a polar polymeric material having two or more acrylate or vinyl end groups (e.g. polyethylene glycol diacrylate) results in a random block copolymer films with superior dielectric and mechanical properties. Incorporation of such copolymer films into a dielectric elastomer actuator improves the static and dynamic properties of the actuator (i.e. minimal actuation drift, faster actuation response and recovery times). Advantageously, the properties of the copolymer films can be tuned accordingly by varying the amount of the polar polymeric material having two or more acrylate or vinyl end groups for different applications. A transparent actuator can also be obtained with the use of any suitable transparent or less optically absorbing electrodes.

Thus, in a first aspect of the invention, there is provided a buckling actuator, comprising:
a first electrode;
a second electrode; and
a film of a dielectric elastomeric material having a first surface and a second surface sandwiched between the first and second electrodes, the material formed by the random block copolymerisation of:
a polymeric material comprising silicon or nitrogen atoms that has two or more acrylate or vinyl end groups; and
a polar polymeric material having two or more acrylate or vinyl end groups
wherein:
the first electrode is arranged to cover a first electrode area on the first surface of the film of dielectric elastomeric material and the second electrode is arranged to cover a second electrode area on the second surface of the film of dielectric elastomeric material, such that there is a region of overlap between the first and second electrode areas that has an area that is smaller than an area of the first or second surfaces of the film of dielectric elastomeric material.

In embodiments herein, the word "comprising" may be interpreted as requiring the features mentioned, but not limiting the presence of other features. Alternatively, the word "comprising" may also relate to the situation where only the components/features listed are intended to be present (e.g. the word "comprising" may be replaced by the phrases "consists of" or "consists essentially of"). It is explicitly contemplated that both the broader and narrower interpretations can be applied to all aspects and embodiments of the present invention. In other words, the word "comprising" and synonyms thereof may be replaced by the phrase "consisting of" or the phrase "consists essentially of" or synonyms thereof and vice versa.

When used herein, the term "buckling actuator" is intended to refer to a buckling mode actuator that requires the components listed above, but which may also contain additional components. A buckling mode actuator displays an out of plane deflection when a voltage is applied across a dielectric elastomer (DE) that forms part of said actuator.

When used herein, the term "first electrode" and "second electrode" are intended to refer to a conductive material that is placed on the first and second surfaces of the dielectric elastomeric material. Any suitable material capable of conveying an electric current may be used as the first and second electrodes, though it is preferred that the material used is provided in a compliant form. Suitable materials that may be mentioned herein include, but are not limited to, carbon grease, one or more metal nanowires, hydrogels, ionogels, carbon nanotubes, liquid metal and combinations thereof. Any suitable metal may be used in the metal nanowires, though in particular embodiments that may be mentioned herein, the metal nanowires may be formed from silver. As will be appreciated, the first and second electrodes may not need to be made of the same materials. As such, the first and second electrodes made of different materials may be used accordingly.

When used herein, the term "liquid metal" is intended to refer to elemental metals or metallic alloys with very low melting points, which form a eutectic that is liquid at room temperature. Examples of elemental metals that may be used as liquid metals include mercury, caesium, rubidium, francium and gallium. It will be appreciated that the use of metals that present less risk to health is preferred in applications where the buckling actuator may be in close proximity to (or worn on the body of) a person. As such, stable isotopes of the radioactive metals may be used. When an alloy is used as the liquid metal it may be any suitable alloy, such as a galinstan alloy, whose components are gallium, indium and tin in proportions suitable for forming a eutectic alloy at room temperature (e.g. 68 wt % Ga, 22 wt % In, and 10 wt % Sn).

In embodiments of the invention that may be mentioned herein, the first and second electrodes may be formed from silver nanowires.

As noted above, the first and second electrodes sandwich a film of a dielectric elastomeric material that has a first surface and a second surface. As such, the first electrode may be formed on the first surface of the film and the second electrode may be formed on the second surface of the film of dielectric elastomeric material. In order to operate efficiently, the placement of the first and second electrodes on the film of dielectric elastomeric material may be substantially identical, such that the degree of overlap is essentially complete, barring manufacturing tolerances and any further wiring that may be needed to supply current to said electrodes.

In order to properly function, at least part of the first and second surfaces of the film of dielectric elastomeric material should not be covered by the first and second electrodes, respectively. In examples that may be mentioned herein, the first and second electrode areas may each occupy an area of from 5% to 50%, such as from 10 to 40%, such as from 15 to 30% on the first and second surfaces of the film of dielectric elastomeric material, respectively.

For the avoidance of doubt, it is explicitly contemplated that where a number of numerical ranges related to the same feature are cited herein, that the end points for each range are intended to be combined in any order to provide further contemplated (and implicitly disclosed) ranges. Thus, in relation to the above related numerical ranges, there is disclosed areas of from:
5% to 10%, 5% to 15%, 5% to 30%, 5% to 40%, 5% to 50%;
10% to 15%, 10% to 30%, 10% to 40%, 10% to 50%;
15% to 30%, 15% to 40%, 15% to 50%;
30% to 40%, 30% to 50%; and
40% to 50%.

As noted hereinbefore, the buckling actuator requires the presence of a film of a dielectric elastomeric material. Dielectric elastomeric materials are a type of smart material that can produce a large strain (i.e. a mechanical deformation) when subjected to an external stimulus (i.e. the application of an electric current). In addition, when a dielectric elastomeric material is subjected to such a strain, it may also generate an electric current due to said strain. The film of dielectric elastomeric material used in the aspects and embodiments of the invention disclosed herein is formed by the random block copolymerisation of a polymeric material comprising silicon or nitrogen atoms that has two or more acrylate or vinyl end groups and a polar polymeric material having two or more acrylate or vinyl end groups.

When used herein "acrylate end group" is intended to cover any acrylate group that may be feasibly used in such copolymerisation reactions. Examples of suitable acrylate groups include the acrylate group itself with no substituents or alkyl derivatives thereof, such as methyl methacrylate, ethyl methacrylate and the like.

Similarly, when used herein "vinyl end group" is intended to cover any vinyl group that may be feasibly used in such copolymerisation reactions. Examples of suitable vinyl groups include the vinyl group itself with no substituents or alkyl derivatives thereof, such as a methyl group, an ethyl group and the like on one or more of the unsubstituted positions of an unsubstituted vinyl group. Examples of suitable polymeric material comprising silicon or nitrogen atoms that has two or more vinyl end groups may be derived by analogy from the polymeric material comprising silicon or nitrogen atoms that has two or more acrylate end groups disclosed herein.

In particular embodiments of the invention, acrylate end groups may be preferred.

The film of a dielectric elastomeric material is formed by the random block copolymerisation of a polymeric material comprising silicon or nitrogen atoms that has two or more acrylate or vinyl end groups and a polar polymeric material having two or more acrylate or vinyl end groups. As will be appreciated, the exact structure(s) of the resulting copolymerised materials will depend on the number of acrylate or vinyl ends groups present. Without wishing to be bound by theory, in embodiments where both the polymeric material comprising silicon or nitrogen atoms and the polar polymeric material have two acrylate or vinyl end groups, it is believed that the resulting product may have one of more structures selected from formula Ia, Ib and Ic, where A represents the polymeric material comprising silicon or nitrogen atoms and B represents the polar polymeric material.

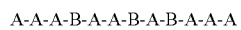

Ia

A-A-A-B-A-A-B-A-B-A-A-A

Ib

A-A-B—A-A-A-B-B-A

|
A
|

B-A-B—A-B-B-A-A-A

Ic

B-A-A—B-A-A-B-B-A

|
A
|

A-A-A—A-A-B-A-A-A

Without wishing to be bound by theory, it is believed that the introduction of the polar polymeric material (e.g. PEGDA) results in a significant change to the mechanical properties of the resulting copolymeric material(s). This could be due to the increased number of chemical crosslinks within the polymer matrix caused by the addition of the polar polymeric material, which may act to anchor the polymer chains to one another and hence minimise the slipping of the polymer chains across one another. This is evidenced by a significant reduction in the viscoelastic nature and elongation at break properties of the resulting copolymeric material(s) when compared to a material that only contains polymeric material comprising silicon or nitrogen atoms, which showed a high elongation at break (see Example 2). Additional evidence is supplied by the fact that the hysteresis loss during mechanical cyclic loading reduces with an increased concentration of the polar polymeric material (e.g. PEGDA) in the dielectric elastomeric material. This reduction in hysteresis loss indicates that energy dissipation from molecular motion reduces. Further, the resulting copolymeric materials also have higher dielectric constants than that of a polymeric material that does not include a polar polymeric material. As will be appreciated, when such copolymeric material(s) are incorporated into the buckling actuator of the current invention, the enhanced properties of the materials disclosed herein improve the performance of the actuator.

As will be appreciated, the formulae Ia to Ic are intended to illustrate the possible structures that may be obtained through the reaction of the polymeric material comprising silicon or nitrogen atoms having two acrylate or vinyl end groups with the polar polymeric material having two acrylate or vinyl end groups described above. This is because the reaction between these materials will be random and so there is no way to predict the exact combination of the components A and B (as defined above). Further, it will also be appreciated, that one or more of these structures may be present in the reaction product, which may therefore be described as a mixture comprising one or more of the suggested structures of formula Ia to Ic.

Finally, it will be appreciated that when one or both of the polymeric material comprising silicon or nitrogen atoms and/or the polar polymeric material have three or more acrylate or vinyl end groups the resulting copolymer, or polymeric network, mixtures can be derived by analogy to the above description of the situation where there are two acrylate or vinyl end groups on each component.

As noted below, urethane acrylate polymeric materials (PUAs) may be useful as the polymeric material comprising silicon or nitrogen atoms. In general, any alternative to PUA used in a buckling dielectric elastomer actuator (DEA) should have a high strain at break and thus a low elastic modulus. This ensures that the dielectric elastomer is easily deformed when an electric field is being applied, allowing out of plane displacements to occur. However, to reduce the tendency for electromechanical instabilities, the modulus should not be too low. As such, the elastic modulus may be between e.g. of from 0.1 to 4 MPa, such as from 0.3 to 4 MPa.

Any suitable polymeric material comprising silicon or nitrogen atoms that has two or more acrylate or vinyl end groups may be used in embodiments of the invention. Examples of suitable polymeric materials comprising silicon or nitrogen atoms that have two or more acrylate or vinyl end groups include, but are not limited to, a urethane acrylate polymeric material that has two or more acrylate end groups, a poly(dimethylsiloxane) dimethacrylate, and a thermoplastic polyurethane that has two or more acrylate end groups.

Suitable polymeric materials comprising silicon or nitrogen atoms that have two or more acrylate or vinyl end groups may be a material that has a number average molecular weight of more than 20,000 Daltons (e.g. from 20,001 to 50,000 Daltons). Without wishing to be bound by theory, it is believed that if the number average molecular weight is less than 20,000, it would not be able to form a film and the resulting material is also too rigid. In addition, suitable polymeric materials comprising silicon or nitrogen atoms that have two or more acrylate or vinyl end groups may be a material that has an elongation to break that is greater than or equal to 200% (details of how the elongation to break is measured are provided in the examples section below).

In embodiments of the invention that may be described herein, one or both of the polymeric material comprising silicon or nitrogen atoms that has two or more acrylate or vinyl end groups and the polar polymeric material having two or more acrylate or vinyl end groups may have two acrylate end groups.

Any suitable urethane acrylate polymeric material that has two acrylate end groups may be used in embodiments of the invention. Examples of such suitable materials include, but are not limited to, aliphatic acrylate polymeric materials that have two acrylate end groups. Examples of aliphatic acrylate polymeric materials that have two acrylate end groups include, but are not limited to, CN310, CN8881, CN8884, CN8888, CN9004, CN9014, CN9028, CN9031, CN9002, CN966J75, CN9018, CN9021, CN3108, CN3211, CN8004 and combinations thereof. In particular embodiments of the invention that may be mentioned herein, the urethane acrylate polymeric material that has two acrylate end groups may be CN9021.

As will be appreciated, the names provided above are tradenames used for the aliphatic acrylate polymeric materials that have two acrylate end groups. However, while it is believed that these materials have a common structure, represented below as formula II, the exact compositions of these materials is retained by the manufacturers as a trade secret.

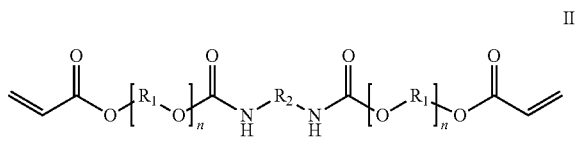

II

The —[O—R$_1$]$_n$— group above in formula II may be selected from polyolys or polyacrylates. When used herein "n" is provided to indicate that this is a repeating unit. As a number of the aliphatic acrylate polymeric materials that may be used herein are commercial materials where the exact structure is only known to the manufacturer of said compounds, a specific numerical range for n is not explicitly stated herein.

Examples of suitable polyols that may be used in the above-mentioned materials include, but are not limited to polyethylene glycol and poly (propylene glycol). Examples of suitable polyacrylates that may be used in the above-mentioned materials include, but are not limited to, poly(2-hydroxyethyl methacrylate), poly(2-hydroxyethyl acrylate), and poly(2-hydroxybutyl acrylate). As will be appreciated, the terms "polyols" and "polyacrylates" are used herein to refer to the polymeric materials that form part of the aliphatic acrylate polymeric materials disclosed herein. For the avoidance of doubt, the term "polyols" may be used herein to refer to polyethers, such as polyethylene glycol.

The R$_2$ group above in formula II may be selected from an isocyanate. Examples of suitable isocyanates that may be used in the above-mentioned materials include, but are not limited to hexamethylene diisocyanate (HDI), isophorone diisocyanate (IDI), bis (4-isocyanatocyclohexyl)methane (H$_{12}$MDI), and 4,4'-methylenebis(phenyl isocyanate) (MDI).

When used herein, the term "polar polymeric material" herein may be intended to refer to a material that has a number average molecular weight of from 200 to 1,000 Daltons (e.g. of from 250 to 750 Daltons, such as from 400 to 600 Daltons, such as 575 Daltons). Said polar polymeric materials have a polymeric structure that will tend align with the field direction of an alternating electric field. Additionally or alternatively, when used herein the term "polar polymeric material" may refer to a material that has a higher dielectric constant than the polymeric material comprising silicon or nitrogen atoms that has two or more acrylate or vinyl end groups. The elongation to break of the polar polymeric material may be from 0 to 150% (details of how the elongation to break is measured are provided in the examples section below). As will be appreciated, some of the polar polymeric materials listed here may not be able to form a film due to their low molecular weights, meaning that these materials effectively have an elongation to break of 0%.

Without wishing to be bound by theory, the selection of a polar polymeric material having a number average molecular weight in the range of from 200 to 1,000 Daltons, may enable the material to act as a crosslinking agent in the dielectric elastomeric material described herein. In addition, without wishing to be bound by theory, it is believed that the polar polymeric material (e.g. poly(ethylene glycol) diacrylate (PEGDA)) may have a relatively high density of polar groups for its molecular weight compared to the polymeric material comprising silicon or nitrogen atoms.

For the avoidance of doubt, the polar polymeric materials described herein do not contain silicon. In particular embodiments that may be mentioned herein, the polar polymeric materials mentioned herein do not contain silicon and/or nitrogen atoms.

The polar polymeric material used herein may provide crosslinks to the resulting dielectric elastomeric material. Although the presence of these chemical crosslinks increases the elastic modulus of the dielectric elastomeric material, the introduction of the additional polar groups that are present in the polar polymeric material enhances the dielectric constant of the dielectric elastomeric material, counteracting its impact on actuation performance, such as the maximum area strain and work density.

In embodiments described hereinbelow, poly(ethylene glycol) diacrylate (PEGDA) was used as the polar polymeric material in combination with CN9021. In these embodiments, as the concentration of PEGDA increases, the observed elastic modulus also increases, resulting in the suppression of electromechanical instability. This provides a critical difference between the use of PEGDA (and similar polymeric molecules) and small crosslinking molecules such as 1,6-hexanediol diacrylate (HDDA). When comparing the chemical structure of HDDA and PEGDA (structure of PEGDA is as shown in FIG. 1b), it can be observed that there is significantly more polar groups (C—O) in PEGDA compared to HDDA that leads to an overall increase in the dielectric constant. This highlights that the polar polymeric molecule, which may act as a polar crosslinking agent, needs to contain a repeating unit with polar groups.

An alternative to PEGDA should contain sufficient polar groups such that the dielectric permittivity of the resultant polymer is increased. Also, these polar compounds should be di-(or more-) functional groups that can be reacted such that they may act as polar cross-linkers to anchor the polymer chains for tuning of the viscoelasticity. Examples of such groups are provided below.

Any suitable polar polymeric material having two or more acrylate or vinyl end groups may be used. For example, the polar polymeric material having two or more acrylate or vinyl end groups may be selected from the list including, but not limited to, poly(trimethylolpropane triacrylate-co-ethylene dimethacrylate), poly(ethyleneglycol) diacrylate (PEGDA), poly(caprolactone) dimethacrylate, poly(propylene glycol) dimethacrylate and combinations thereof. In particular embodiments that may be mentioned herein, the polar polymeric material having two or more acrylate or vinyl end groups may be poly(ethyleneglycol) diacrylate (PEGDA). As noted hereinbefore, the polar polymeric material having two or more acrylate or vinyl end groups may have two acrylate end groups.

Any suitable molecular weight for the polar polymeric material having two or more acrylate or vinyl end groups may be used to form the dielectric elastomeric material. For example, the polar polymeric material having two or more acrylate or vinyl end groups may have a number average molecular weight of from 200 to 1,000 Daltons, such as from 250 to 750 Daltons, such as from 400 to 600 Daltons, such as 575 Daltons.

Any suitable amount of the polymeric material comprising silicon or nitrogen atoms that has two or more acrylate or vinyl end groups and the polar polymeric material having two or more acrylate or vinyl end groups may be used herein in the dielectric elastomeric material. In embodiments of the invention, the polar polymeric material having two or more acrylate or vinyl end groups may be present in the dielectric elastomeric material in an amount of from 5 to 15 wt %, such as 10 to 15 wt %. The balance of the dielectric elastomeric material may be the polymeric material comprising silicon or nitrogen atoms that has two or more acrylate or vinyl end groups and remnants of any initiator used in the reaction to form said dielectric elastomeric material.

The dielectric elastomeric material formed from the reaction of the polymeric material comprising silicon or nitrogen atoms that has two or more acrylate or vinyl end groups and the polar polymeric material having two or more acrylate or vinyl end groups may have one or more of:

(Ai) a dielectric constant ($\varepsilon_r$) of greater than 3, such as from 3.1 to 100, such as from 5.8 to 20, such as from 6 to 15, such as from 6.2 to 9.4;

(Aii) elastic modulus of from 0.1 to 4 MPa, such as from 0.3 to 4 MPa;

(Aiii) a dielectric breakdown of less than or equal to 30 V/μm, such as from 10 V/μm to 25 V/μm, such as from 8 V/μm to 25 V/μm, such as from 10 V/μm to 20 V/μm; and (Aiv) an elongation to break of greater than 50%, such as from 50 to 960%, such as from 50 to 500%, such as 150 to 450%, such as 423%.

Details of how these properties are measured are provided in the experimental section below.

The dielectric breakdown can be determined at the electric field (for a particular material) where there is a surge of current above 0.01 mA during actuation measurements. The elongation to break can be determined from a tensile test as described in the examples section below.

The resulting buckling actuator may have a displacement upon supply of a voltage to the first and second electrodes of less than or equal to 1,250 μm, such as from 100 to 1,250 μm, such as from 500 to 1,250 μm, such as from 250 to 750 μm, such as from 1,000 to 1,250 μm. Details of how this property is measured is provided in the experimental section below. More particularly, the displacement of 100 to 1,250 μm may refer to static feedback, while the displacement may be around 0.1 μm (e.g. from 0.01 to 10 μm, such as from 0.05 to 1 μm) for dynamic feedback.

When used herein, the term "dynamic displacement" refers to displacements that are achieved by applying an alternating current (AC) electric field, where the buckling actuator may rapidly change form due to the fluctuation electric field. In contrast, "static displacements" when used herein refer to a displacement that is generated by a direct current (DC) electric field, where the actuator will buckle and not return to its original state until the electric field is removed.

Figure 8:
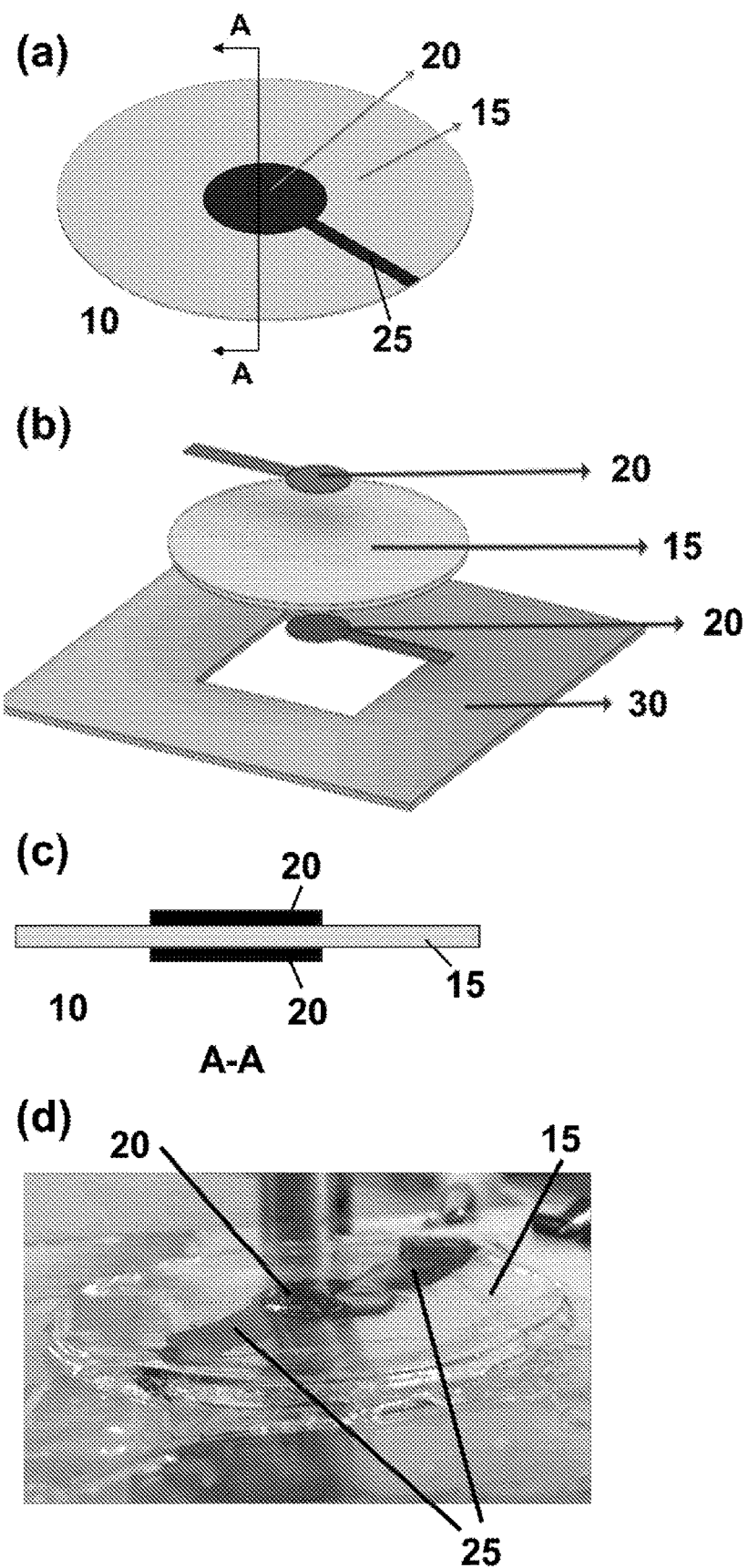
FIG. 8 Depicts: (a) a schematic representation of a dielectric actuator (DEA) (10) according to the current invention; (b) the layered arrangement of the DEA on a substrate (30); (c) a cross-section view A-A of the DEA (10) in (a); and (d) a photograph of the DEA of the current invention.

Without wishing to be bound by theory, the buckling (or out of plane deflection) is typically induced by the compressive stress generated along the entire actuator during the application of a voltage. This causes a conflict between the expansion of the electro-active area (region with overlapping electrodes) and the electro-passive area (region with no electrodes) as shown in FIG. 8a. When a voltage is applied to the electrodes, the electro-active region will attempt to expand. However, as there is no voltage being applied to the electro-passive region, it will remain stagnant or "fixed". As such, the electro-passive region thereby opposes the expansion of the electro-active region and generates a compressive stress that causes buckling.

For stable out-of-plane actuation, the area of the active region (overlapping electrodes) should be at most 50% of the entire area of the dielectric elastomer. For example, the first and second electrode areas may each occupy an area of from 5% to 50%, such as from 10 to 40%, such as from 15 to 30% on the first and second surfaces of the film of dielectric elastomeric material, respectively. This ensures that the passive region provides sufficient compressive stresses to induce out of plane actuation.

As will be appreciated, an advantage associated with the currently described buckling actuator systems is that they do not need to include any rigid boundaries or any frame (rigid or otherwise) to induce compressive stress. As such, it is possible for the buckling actuator described herein to also be placed onto a flexible substrate (for e.g. a polyethylene terephthalate (PET) substrate as shown in Example 6 and FIG. 18a) to provide flexibility. In such embodiments, the second electrode may be placed on the flexible substrate and the film of dielectric elastomeric material is formed on top of at least part of the second electrode and flexible substrate. As will be appreciated, as the terms "first" and "second" as described herein are essentially arbitrary, the reverse arrangement it true. Such material also allows the development of a fully flexible actuator which can operate even in the bent state.

In yet further embodiments, it would also be possible to affix a flexible substrate to both the first and second surfaces of the buckling actuator if that is desirable.

As noted above, the buckling actuators disclosed herein do not need to include any kind of rigid constraint members. Thus, the buckling actuators described herein are capable of producing out-of-plane actuation without rigid constrain members being present when a voltage is applied.

Given the type of materials that are used to make the buckling actuators described herein, a further advantage associated with these devices is that they may be transparent. In other words, the dielectric elastomeric material, the first and second electrodes and, where present, any flexible substrate(s) may all be selected to be transparent.

In addition, the use of the dielectric elastomeric material in the buckling actuator allows the actuator to achieve superior performance in comparison to the use of a material that only contains polymeric material comprising silicon or nitrogen atoms. These improved performances include a stable and larger actuation with minimal drift, and faster response and recovery times, which are described in the examples below. Further, the pull-in instabilities of the actuator are suppressed, therefore allowing an enhanced actuation performance with a larger out-of-plane displacement height (i.e. of up to 1.5-2.0 mm, see FIGS. 14a and 21b), which is greater than the minimum skin deformation necessary for detection in haptic devices.

As will be appreciated, applications of the buckling actuators disclosed herein may involve a single buckling actuator used alone, multiple buckling actuators used entirely in isolation from one another or multiple buckling actuators used in an array. As such, there is also disclosed herein an array of buckling actuators comprising a plurality of buckling actuators. An example of such an array of buckling actuators is an array where the buckling actuators are arranged in a cross-junction configuration. Further details of this arrangement are described in the examples section below. As will be appreciated, any suitable array of the buckling actuators may be used. When used herein, the term "array of actuators" is intended to refer to multiple actuators that are electrically linked together, such that more than one of the actuators can be activated at any one time by a single power source.

In a further aspect of the invention, there is also disclosed a dielectric elastomeric material formed by the random block copolymerisation of:
  a polymeric material comprising silicon or nitrogen atoms that has two or more acrylate or vinyl end groups; and
  a polar polymeric material having two or more acrylate or vinyl end groups.

As will be appreciated, the dielectric elastomeric material disclosed in this aspect is identical to that disclosed above as part of the buckling actuator and so the variations described above for the dielectric elastomeric material also apply here and will not be repeated.

The dielectric elastomeric material described above may be formed by any suitable method.

A particular method that may be used herein comprises the steps of:
  (i) providing a mixture comprising a polymeric material comprising silicon or nitrogen atoms that has two or more acrylate or vinyl end groups with a polar polymeric material having two or more acrylate or vinyl end groups in the presence of a radical initiator and optionally in the presence of a solvent; and
  (ii) reacting the mixture for a period of time at an elevated temperature to provide the dielectric elastomeric material.

While no solvent is required in the reaction per se, it may be useful to include a solvent when seeking to fabricate a thin film of 200 μm or below, as the viscosity of the materials used may make this challenging to accomplish otherwise. As will be appreciated, the mixture (with solvent) may be cast onto a petri dish (or other vessel) and the solvent allowed to evaoporate away to leave behind the desired thin film. Additionally or alternatively, a solvent may be added (if needed) to help control the viscosity of the mixture in order to facilitate the printing of the dielectric elastomeric material.

As the polymeric material comprising silicon or nitrogen atoms that has two or more acrylate or vinyl end groups and the polar polymeric material having two or more acrylate or vinyl end groups have been described in detail above, they are not described here. For the avoidance of doubt, the descriptions provided above for the polymeric material comprising silicon or nitrogen atoms that has two or more acrylate or vinyl end groups and the polar polymeric material having two or more acrylate or vinyl end groups apply to these components in the method of forming the dielectric elastomeric material.

As will be appreciated, as the dielectric elastomeric material described herein may see application in a buckling actuator as described herein, the dielectric elastomeric material may be provided in the form of a film following completion of step (ii) above.

In embodiments of the method described above, the solvent and the polymeric material comprising silicon or nitrogen atoms that has two or more acrylate or vinyl end groups may have a weight to weight ratio of from 10:1 to 1:1, such as from 3:1 to 1:1. As will be appreciated, any suitable solvent that is compatible with the reaction conditions may be used. Suitable solvents include, but are not limited to, acetone and/or isopropyl alcohol.

The reaction in step (ii) above involves an elevated temperature—that is a temperature above the normal ambient temperature of the surroundings where the reaction takes place. Any suitable elevated temperature may be used. Examples of suitable elevated temperatures include, but are not limited to, 50 to 100° C., such as from 70 to 90° C. As will be appreciated, the temperature of the reaction may be limited to the boiling temperature of any solvent present, which will be influenced in turn by the amount of the polymeric material comprising silicon or nitrogen atoms that has two or more acrylate or vinyl end groups and the polar polymeric material having two or more acrylate or vinyl end groups present within it. In embodiments where the solvent reaches its boiling temperature, the reaction may be run under reflux conditions, such that the evaporating solvent is condensed and returned to the reaction mixture.

The reaction in step (ii) above may be run for any suitable period of time to provide the desired dielectric elastomeric material. Examples of a suitable period of time includes, but is not limited to, a period of from 10 minutes to 24 hours, such as from 15 minutes to 12 hours, such as 20 minutes to 1 hour, such as 30 minutes.

As noted above, the reaction mixture used in step (i) of the method to manufacture the dielectric elastomeric material requires the presence of a radical initiator. Any suitable radical initiator for use with acrylate groups (as defined herein to encompass alkyl acrylate groups) and/or vinyl groups may be used in said method. Any suitable amount of the radical initiator may be used. For example, the radical initiator is present in an amount of at least 1 wt % of the mixture (e.g. from 1 wt % to 10 wt %, such as from 1 wt % to 5 wt % of the mixture). When used herein, the term "mixture" is intended to refer to all components except any solvent (if present).

As will be appreciated, the buckling actuators disclosed herein may be applied to any application where their use may be valuable. These include, but are not limited to, training systems (e.g. for medicine, aerospace and defence), gaming, robotics and braille readers, as well as high precision applications, such as tunable lenses and gratings.

As noted herein, the dielectric elastomeric materials described herein are able to achieve a maximum area of strain that is notably higher than that achievable by low viscoelastic materials, such as silicone, which also requires a higher operating voltage. In addition, as noted hereinbefore, the buckling actuators disclosed herein do not need to include rigid components, which are typically used to achieve a prestretched state for reduced viscoelastic effects and improved actuation performance. By not needing rigid components to function, the disclosed buckling actuators are more easily integrated into soft and flexible bodies, which may enable them to be more readily used in the formation of wearable devices.

Further aspects and embodiments of the invention will now be described by reference to the following examples.

EXAMPLES

Materials

CN9021, an aliphatic polyurethane acrylate (PUA) developed for laminating and pressure sensitive adhesives, was purchased from Sartomer Company and was used as received. The CN9021 was stated to have: a viscosity (at 60° C.) of 1500-3500 cps; elastic modulus of 0.827 MPa; and a glass transition temperature of −54° C. Polyethylene glycol diacrylate (PEGDA) with average $M_n$ of 575 and 2000, and azobisisobutyronitrile (AIBN) were obtained from Sigma Aldrich and used as received. Carbon grease was purchased from Nanjing Xilite Adhesive Co. Ltd. and was used as received. Silver nanowires with an average diameter of 50 nm and length of 100-200 µm were purchased from XFANO. The silver nanowires were dispersed in isopropyl alcohol at a concentration of 0.5 mg/mL.

General Method 1—Characterisation of the Performance of the Dielectric Elastomer Actuator (DEA)

The vertical deflection from the center of the electrode was determined using an Epsilon optoNCDT laser displacement sensor. For static actuation experiments, the voltage was increased by 0.5 kV every 10 seconds. Actuation strains were determined by calculating the change in the electrode area through geometric relations. Cyclic actuation measurements were performed using a Trek™ Model PD05034 high voltage AC power amplifier to amplify the signal generated from the pulse generator. The cyclic measurements were performed at a frequency of 0.5 Hz with an electric field strength of 10 kV µm$^{-1}$, unless stated otherwise. To evaluate the response times, the generated wave profiles were obtained at a frequency of 0.1 Hz with an electric field strength of 10 kV µm$^{-1}$. The response time $t_{0.9}$ of the actuator was quantified by the time taken to reach 90% of the maximum displacement for each cycle. Three samples were tested for each copolymer formulation.

Example 1. Synthesis and Characterisation of PUA-PEGDA Copolymer Films Containing Various Amount of PEGDA The PUA-PEGDA copolymer films used for fabricating the dielectric elastomer actuator of the current invention were synthesised using polyurethane acrylate (PUA, CN9021) and polyethylene glycol diacrylate (PEGDA) via free radical polymerisation (or random block copolymerisation).

Experimental—Synthesis and Characterisation

A typical synthesis sequence of the PUA-PEGDA copolymer film is described below. PUA (CN9021) was mixed with different concentrations of PEGDA (5, 10 and 15 wt %, $M_n$=575), and 1 wt % of AIBN was added to the mixture and mixed thoroughly. The resultant mixture was degassed for 1 hr to remove air bubbles that may form imperfections in the fabricated film. The resultant degassed mixture was then cured on a hotplate under an inert environment at 90° C. for 1-2 hrs to allow the free radical polymerisation to take place. The as-synthesised polymer film was carefully peeled out and an average film thickness of 0.43 mm was obtained. Pristine PUA (CN9021) films were synthesised via the same polymerisation reaction, but without the addition of PEGDA. The pristine PUA films were denoted as PUA, whereas copolymer films were denoted as PUA-PEGDA-X, with X representing the weight percent of PEGDA.

In general, solvent is not required for the reaction to take place or to prepare the copolymer films of the current invention. However, the high viscosity of the CN9021 polymeric material makes it difficult to fabricate a thin film of <200 µm. Therefore, a thinner film of <200 µm can be made with the addition of acetone to CN9021 resin at a 1:1 weight ratio.

When the mixture (with solvent) is cast onto a petri dish, the solvent is evaporated away, leaving behind a thin film.

Fourier transform infrared (FTIR-ATR, Perkin Elmer, Frontier) spectroscopy was used to measure the FTIR spectra by scanning each film 32 times with a resolution of 4 cm$^{-1}$. $^1$H nuclear magnetic resonance (NMR) spectra of the as-synthesised PUA-PEGDA were measured on a 400 MHz Bruker DPX 400 NMR spectrometer in deuterated chloroform at room temperature. Chemical shifts were reported as δ value (ppm) referenced to the residual chloroform peak.

Results and Discussion

CN9021, a type of polyurethane acrylate (PUA), was copolymerised with PEGDA of low molecular weight ($M_n$=575) using free radical polymerisation (see FIGS. 1a and b for molecular structures of PUA and PEGDA, respectively).

Typically, in the first step (initiation), the AIBN radical initiator is activated at 90° C. to form free radicals that react with monomers of PEGDA or PUA (CN9021) via an addition reaction. In the propagation step, the polymer chain grows via the successive addition of either PEGDA or PUA monomers to form macroradicals. Lastly, in the termination step, the polymeric macroradicals combine together to form a random block copolymer composed of PUA and PEGDA monomers. The feasibility of this mode of polymerisation mechanism can be attributed to the presence of carbon double bonds in the PEGDA and PUA that allows them to undergo addition reactions.

Figure 2:
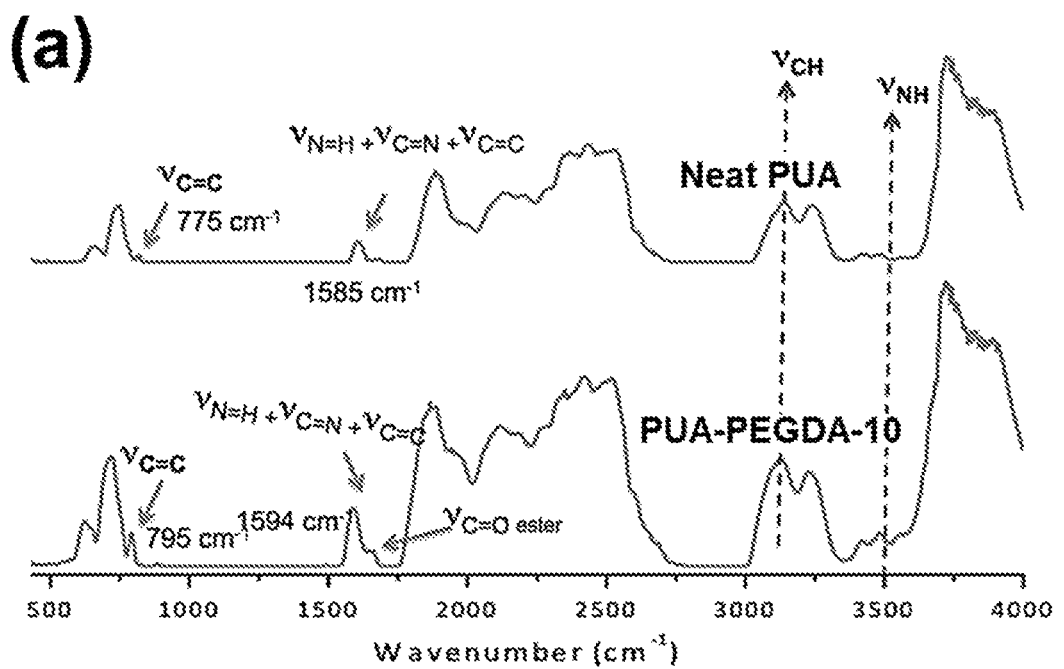
FIG. 2 Depicts the FTIR spectra of: (a) an initial batch; and (b) a subsequent batch of pristine PUA (CN9021) and PUA-PEGDA copolymer films of the current invention.
Figure 2:
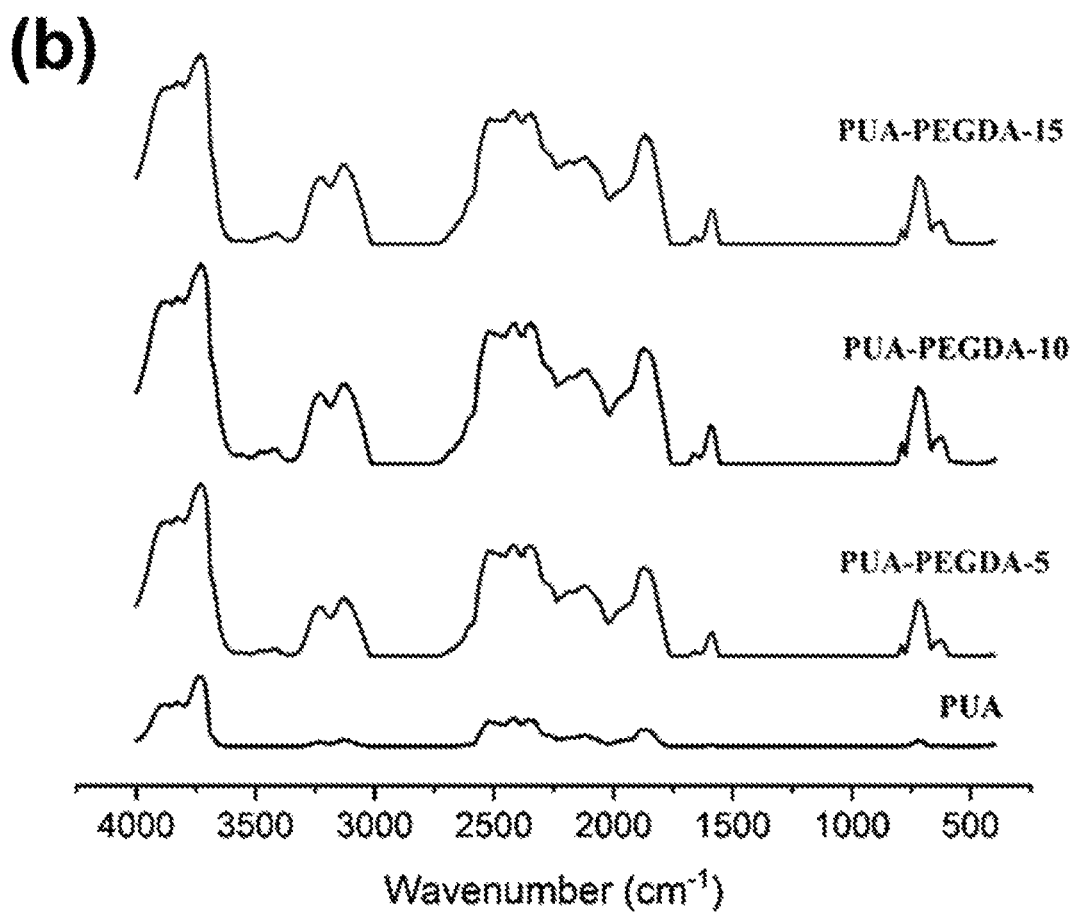

To verify the successful copolymerisation between the two compounds, the as-synthesised polymers were characterised by FTIR (FIGS. 2a and b for initial and subsequent batches of PUA-PEGDA, respectively) and NMR spectroscopy. FTIR measurements of the as-synthesised pristine PUA films displayed absorption peaks for $CH_2$ (—CH stretching consisting of asymmetric —$CH_3$ stretching, asymmetric —$CH_2$ stretching, symmetric —$CH_3$ stretching and symmetric —$CH_2$ stretching) in the region of 2750-3100 cm$^{-1}$, H—C—H scissor bending at 1457 cm$^{-1}$ and =CH stretching at 810 cm$^{-1}$ For PUA-PEGDA copolymers, the appearance of strong characteristic peaks (Table 1), such as the stretching vibrations of —NH— at 3350-3200 cm$^{-1}$, C=O at 1720-1727 cm$^{-1}$ and —NH— at 1520-1580 cm$^{-1}$, confirms the formation of crosslinks between PEGDA and PUA through free radical polymerisation. The peak shift of the C=O stretching vibrations to larger wavenumbers (>1635 cm$^{-1}$) indicated that crosslinking had occurred (i.e. more rigid C=O bond). In addition, peaks at 1635 cm$^{-1}$ which correspond to C=C stretching were also observed, therefore indicating that some C=C bonds remained unreacted. With the successful copolymerisation of PUA and PEGDA, chemical crosslink networks were established between polymer chains, therefore preventing the chains from slipping across one another.

TABLE 1

Characteristic FT-IR peaks of the as-synthesised PUA-PEGDA copolymers

| Wavenumber (cm$^{-1}$) | Functional groups |
|---|---|
| 3050-3750 cm$^{-1}$ | —NH- stretching vibrations |
| 2800-3000 cm$^{-1}$ | CH$_2$ symmetric and anti-symmetric stretching vibrations |
| 1600-1800 cm$^{-1}$ | amide I, CO, C—C stretching vibrations |
| 1507-1585 cm$^{-1}$ | amide II, C—N stretching and N—H bending character (vC—N + δN—H) |
| 1452-1466 cm$^{-1}$ | CH$_2$ scissoring, CH$_3$ deformation and CH$_2$ bending |
| 1344 cm$^{-1}$ | C—H deformation |
| 1200-1297 cm$^{-1}$ | amide III, vC—N and in-plane N—H deformation |
| 1004-1018 cm$^{-1}$ | stretching and rocking vibrations of the C—C and CH$_2$ groups |
| 810 cm$^{-1}$ | C—O stretch + CH$_2$ rocking |
| 764 cm$^{-1}$ | amide IV |
| 656 cm$^{-1}$ | amide V |

Further, the $^1$H NMR spectra of PUA-PEGDA copolymer showed peaks at 5.76-5.86, 6.08-6.18 and 6.41-6.47 ppm (acrylate), which confirmed the presence of acrylate groups in the PUA-PEGDA copolymerised structure. The important characteristic signals of the urethane group (—NH—(C=O)—O—) of the PUA-PEGDA copolymerised samples was also observed in the region of 7.21-7.29 ppm, which indicated the existence of urethane group in the PUA-PEGDA structure.

Example 2. Dielectric and Mechanical Properties of the as-Synthesised PUA-PEGDA Copolymer Films with Various Amounts of PEGDA The dielectric and mechanical properties of the as-synthesised PUA-PEGDA of Example 1 were investigated to study the effect of incorporating various amounts of PEGDA into the copolymer films.

Experimental

Characterisation of Dielectric Properties

Dielectric constant measurements were performed in the frequency range of 1 kHz to 1 MHz using an Agilent E4980a LCR meter. An AC signal of 1 V was applied to the samples, and the dielectric constant was calculated from the capacitance measured with the following relationship: $C=(\varepsilon_0 \varepsilon A)/d$, where A is defined as the overlapping area between the top and bottom electrodes, $\varepsilon_0$ is the vacuum permittivity, C is the measured capacitance, and d is the polymer film thickness. Elastomer samples were placed between two electrodes for measurements.

Characterisation of Mechanical Properties

Tensile test specimens were prepared in accordance with ASTM D638-14, Type V. Tensile tests were performed on an Instron 5567 universal testing machine at a strain rate of 3.33 mm s$^{-1}$. Loading and unloading cyclic tests were performed at a strain rate of 1.0 or 3.33 mm s$^{-1}$ for 10-30 cycles with a limiting strain of 50% (for initial batch) or 100% (for subsequent batch). To obtain the elastic modulus, the gradient of the linear region of the stress strain curve is being measured at ±5% from the respective strains. The mechanical properties of the as-synthesised polymer films are as shown in Table 2.

TABLE 2

Comparison of the mechanical properties of the as-synthesised polymer films.

| Materials | Break tensile strength [MPa] | Elongation at break [%] | $Y_{10\%}{}^a$ [MPa] | $Y_{50\%}{}^b$ [MPa] | Hysteresis loss [%] |
|---|---|---|---|---|---|
| PUA | 1.65 | 960 | 0.337 | 0.100 | 18.74 |
| PUA-PEGDA-5 | 2.33 | 423 | 0.337 | 0.148 | 14.25 |
| PUA-PEGDA-10 | 1.64 | 301 | 0.550 | 0.330 | 8.40 |
| PUA-PEGDA-15 | 0.42 | 168 | 0.323 | 0.168 | 6.91 |

$^a$Apparent modulus at 10% strain calculated from stress-strain curve.
$^b$Apparent modulus at 50% strain calculated from stress-strain curve.

Results and Discussion

Dielectric Properties of the PUA-PEGDA Copolymer Films

Figure 3:
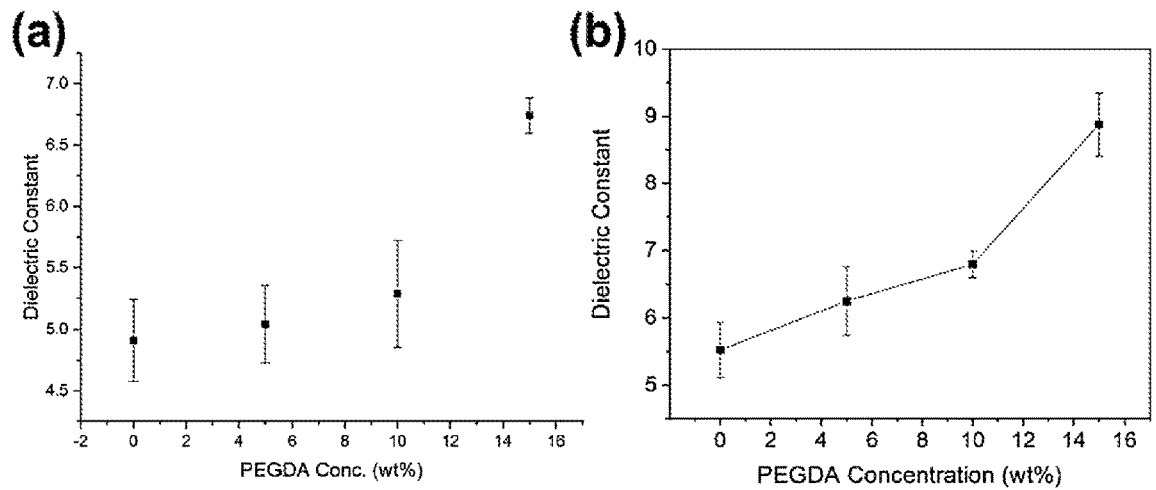
FIG. 3 Depicts the dielectric constants of: (a) initial batch; and (b) subsequent batch of PUA and PUA-PEGDA copolymer films (5, 10 and 15 wt %) measured at 1 kHz. Three samples were measured for each concentration of PEGDA.

For the initial batch of PUA-PEGDA copolymer, it was observed that the addition of PEGDA led to an improvement in the dielectric constant of the as-synthesised PUA-PEGDA copolymer (FIG. 3a). The dielectric permittivity of the subsequent batches of copolymer films with various concentrations of PEGDA was also investigated. Similar to the initial batches, with an increase in PEGDA concentration, a drastic improvement in the permittivity was observed (FIG. 3b). The dielectric permittivity increased from 5.52 to 8.87 at 1 kHz (FIG. 3b), whereas the commercial VHB 4905 (for comparison) has a measured permittivity of 4.4 at 1 kHz. This improvement can be attributed to the increase in polarity of the copolymer film due to the increase in the number of polar C—O and C=O groups with increasing PEGDA content. This finding indicates that the dielectric properties of the films can be tuned by controlling the concentration of PEGDA. This is important as the dielectric permittivity is proportional to the generated Maxwell pressure, therefore, the increase in dielectric constant can help to improve the performance of the dielectric elastomer actuator due to an increase in Maxwell pressure.

Figure 4:
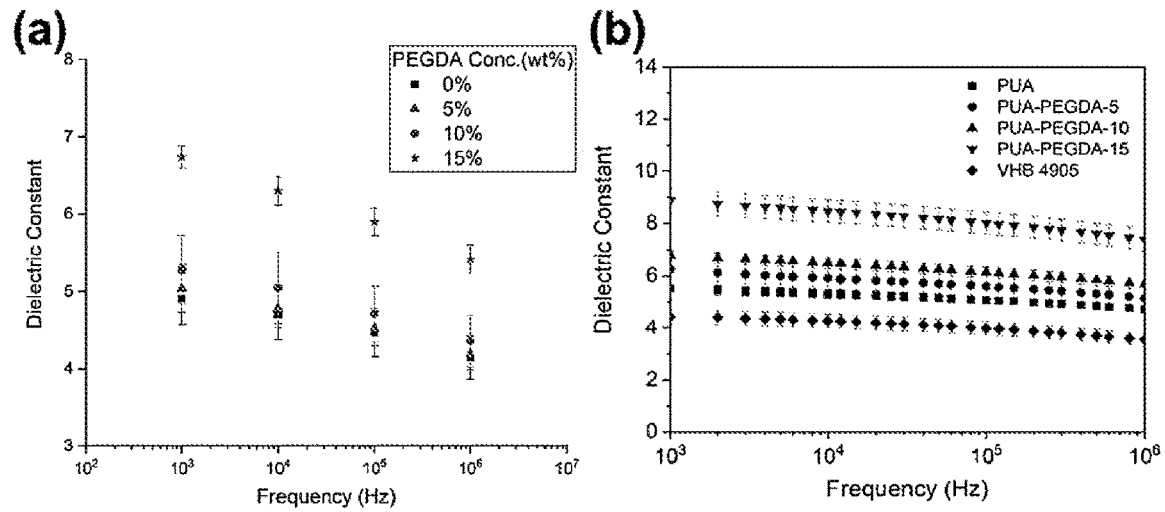
FIG. 4 Depicts the dielectric constants of: (a) initial batch; and (b) subsequent batch of PUA, PUA-PEGDA copolymer films (0, 5, 10 and 15 wt % of PEGDA) and VHB 4905 (for subsequent batch only) measured over a frequency range of 1 kHz to 1 MHz.

As the frequency increases, the permittivity of the copolymer decreases, as shown in FIGS. 4a and b for initial and subsequent batches, respectively. This phenomenon is typically related to dielectric relaxation, in which the polar groups on the polymer chains are unable to keep up with the alternating current, resulting in a loss of contribution to the dielectric permittivity.

Mechanical Properties of the PUA-PEGDA Copolymer Films

Figure 5:
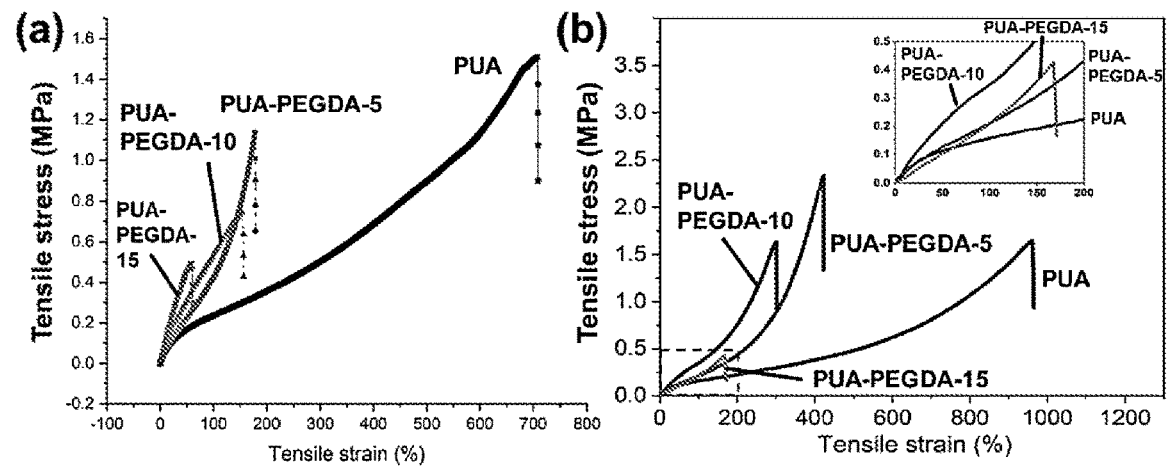
FIG. 5 Depicts stress-strain curves of PUA and PUA-PEGDA copolymer films (5, 10 and 15 wt % of PEGDA) for: (a) initial batch; and (b) subsequent batch, determined from a standard tensile test at a displacement rate of 3.33 mm s$^{-1}$. The inset image in (b) shows magnification at low tensile strains between 0 and 200%.
Figure 6:
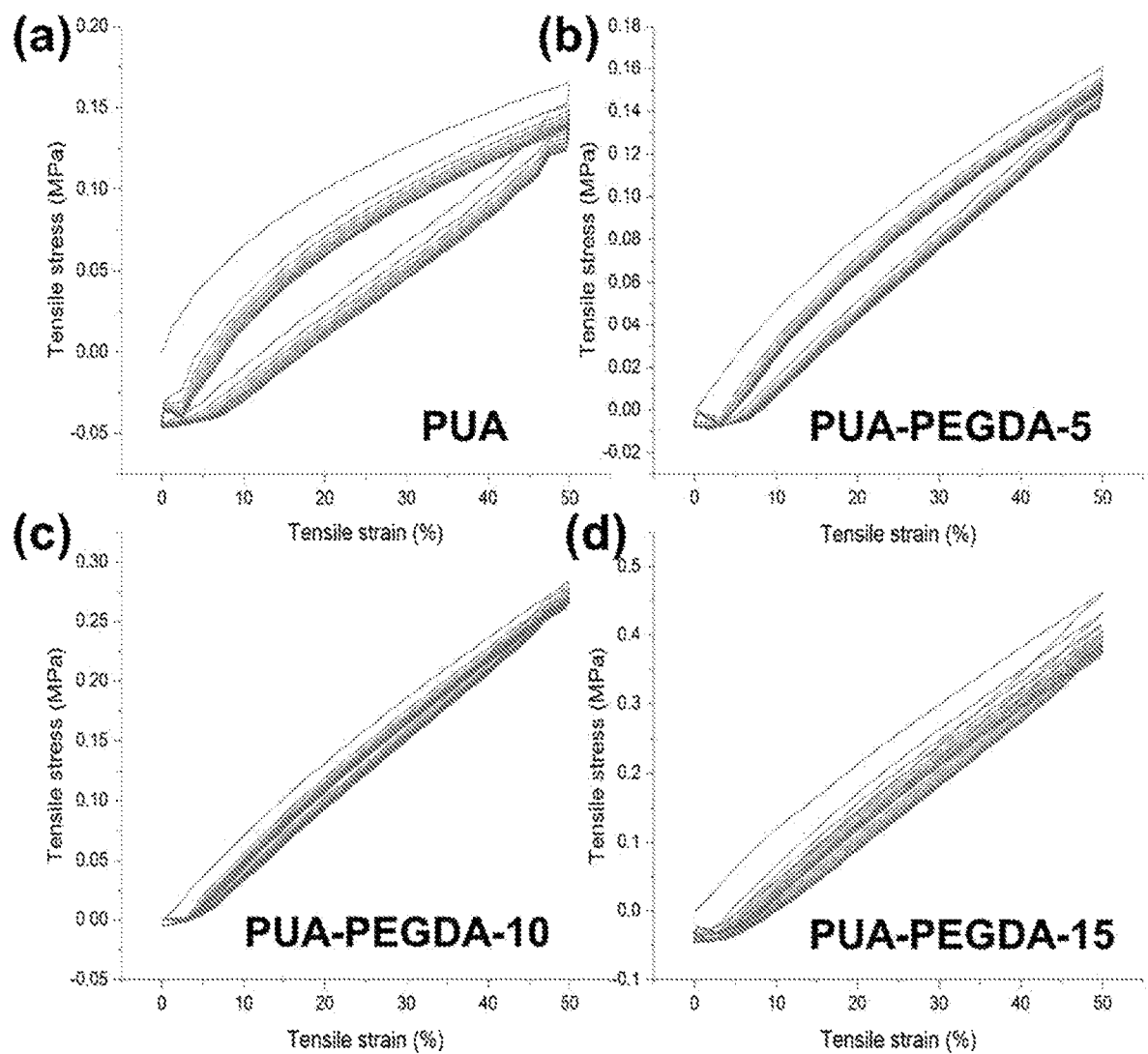
FIG. 6 Depicts the loading and unloading cyclic tests performed on the initial batch of: (a) PUA; (b) PUA-PEGDA-5; (c) PUA-PEGDA-10; and (d) PUA-PEGDA-15 at a strain rate of 3.33 mm s$^{-1}$ for 10 cycles (with maximum strain at 50%), showing the hysteresis behavior of the copolymer films.
Figure 7:
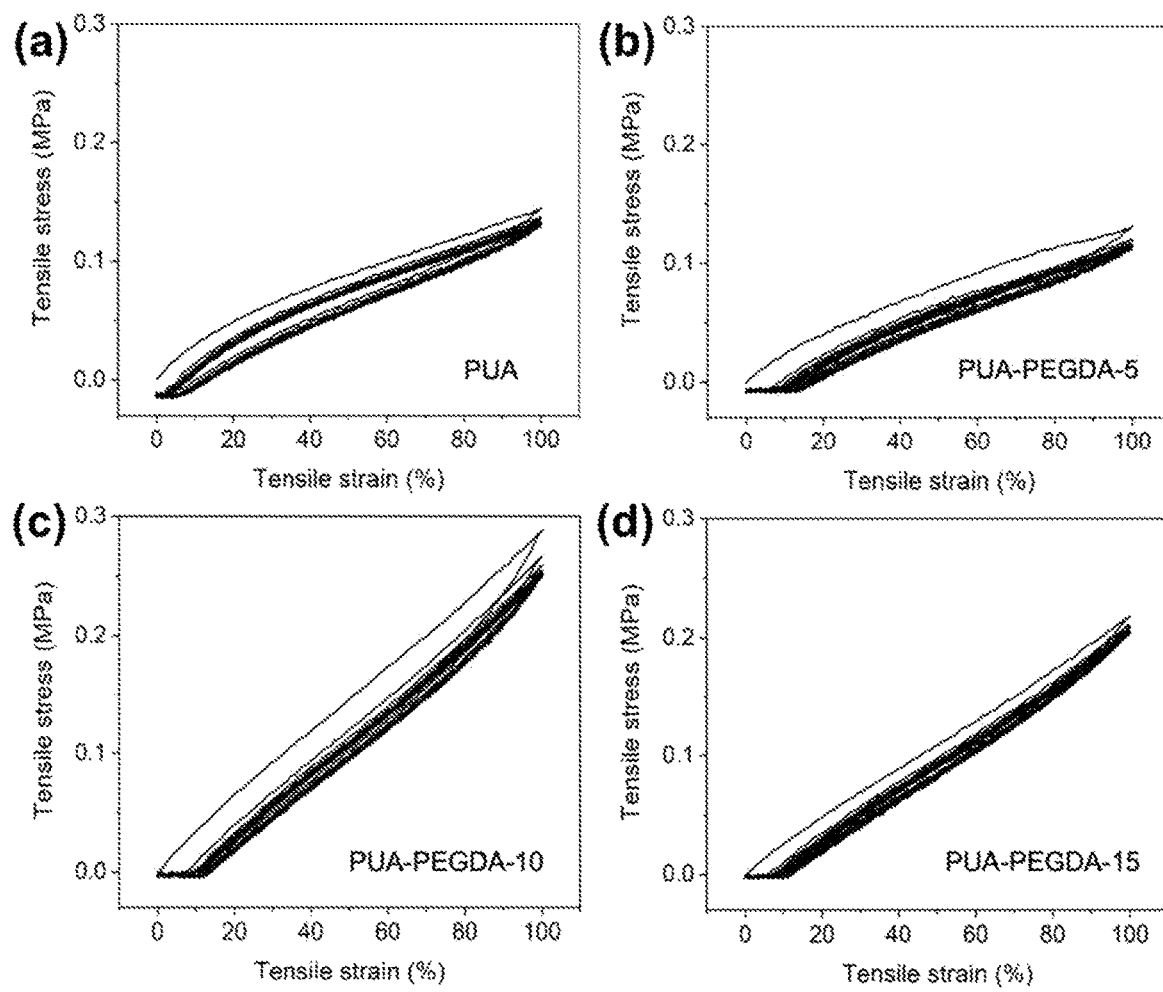
FIG. 7 Depicts the loading and unloading cyclic tests performed on subsequent batch of: (a) PUA; (b) PUA-PEGDA-5; (c) PUA-PEGDA-10; and (d) PUA-PEGDA-15 at a strain rate of 1 mm s$^{-1}$ for 30 cycles (with maximum strain at 100%), showing the reduction in hysteresis loss.

The effects of chemical crosslinks between PEGDA and pristine PUA on the mechanical properties can be observed from the stress-strain curves in FIGS. 5a and b for initial and subsequent batches of copolymer films, respectively. The increase in elastic modulus of the initial batch of copolymer film was observed in the stress-strain curves in FIG. 5a. With an increase in crosslinking density, there may be a decrease in the number of defects such as micro-voids and cracks, therefore improving the dielectric breakdown strength of the polymer.

The subsequent batches of PUA-PEGDA copolymer films with concentrations up to 10 wt % of PEGDA exhibited a non-linear behaviour with a slow, gradual increase in stress at low strains due to the unfolding of polymer chains (FIG. 5b). However, at larger strains, the elastomer exhibits a strain hardening behavior with a rapid increase in the elastic modulus as the polymer chains begin to become taut and aligned.

At 15 wt % PEGDA, the non-linear elastomeric behavior was attenuated accompanied by a reduced maximum attainable elongation due to an increase in crosslinking. This phenomenon was accompanied by a reduction in the apparent modulus, which may be attributed to an increase in length between the crosslink junctions as the probability of PEGDA acrylate groups reacting with each other increased at higher concentrations. As the number of chemical crosslinks between PEGDA and PUA polymer chains increased, the mobility of the chains was severely restricted, which reduced the maximum elongation to 167% from the 960% elongation of the pristine PUA. It was noted that the maximum elongation at 15 wt % of PEGDA is comparable to the maximum elongation of polydimethylsiloxane (PDMS) (Sylgard 184) by Dow Corning. A summary of the mechanical properties of the fabricated films is provided in Table 2 above.

The loading and unloading cyclic tests performed on the initial batch of copolymer films showed the hysteresis behavior of the films which supports the reduction in the viscoelastic nature of the films with increasing PEGDA concentration (FIG. 6a-d). These hysteresis curves were the result of a tensile test that was performed on the polymer films loaded and unloaded at a strain rate of 3.33 mm/s with a limiting strain of 50%. The reduction in hysteresis loss with increasing PEGDA concentration shown in FIG. 6a-d, can be related to the decline of the viscoelastic behavior of the film as a result of chemical crosslinking.

The loading-unloading cyclic tests for the subsequent batch of copolymer films were performed (for 30 cycles at a strain rate of 1 mm s$^{-1}$) to evaluate the viscoelastic behavior of the fabricated copolymers. Similar to the initial batch, the subsequent batch exhibited hysteresis loss, which was represented by the area enclosed in the curve (FIG. 7a-d). This area represents the energy dissipated during cycling, which is related to the internal friction and sliding of polymer chains in viscoelastic elastomers. As a result of the Mullins effect, a large hysteresis loss during the first cycle was observed for all samples, wherein the largest loss was displayed by the pristine PUA sample. After the second cycle, the stress-softening behaviour during cyclic loading began to reach a stationary state with a stable hysteresis loop being formed.

A reduction in hysteresis loss after the first cycle was observed with increasing PEGDA concentration. This was probably due to the increase in crosslinking density between polymer chains, which restricted motion and lowered the dissipative energy. Moreover, the reduction in hysteresis implies a reduced viscoelastic loss, which can be correlated to improved electromechanical stability through cycling tests of up to 1050 cycles (FIG. 17a-h).

This phenomenon aided in the enhanced dynamic response times of the dielectric elastomer actuator which is discussed in Example 5.

Example 3. Fabrication of the Dielectric Elastomer Actuator (DEA) of the Current Invention Using Carbon Grease as the Electrodes The as-synthesised PUA-PEGDA copolymer films of Example 1 were used for fabricating the buckling dielectric elastomer actuator (DEA) of the current invention.

As shown in FIGS. 8a and b, the DEA (10) comprises a layer of the PUA-PEGDA copolymer film (15) coated with an electrically-conductive electrode (20) on each of the top and bottom surfaces of the film (15). The electrodes (20) are positioned on the film (15) such that they overlap each other. The area on the film (15) covered by the electrodes (20) is the electro-active area, while the area not covered by the electrodes is the electro-passive area. In addition, a conducting strip (25) may be applied onto the film (15) to extend the electrode (20) to the perimeter of the film (15). Such conducting strip (25) provides a conducting point for a current source further away from the electrode and nearer to the peripheral of the film (15). This allows the current source to be applied away from the electrodes to minimise disruption to the DEA. Such conducting strip (25) may have the same material as the electrode. For the purpose of the experiment, a glass substrate (30) with a window was used for supporting the DEA. The substrate (30) may be replaced with any other materials (for e.g. cloth, polyethylene terephthalate (PET) or any plastic substrate) to provide flexibility, if necessary. The operation of the DEA has little dependence on the substrate used as it can adopt a wide range of substrates such as cloth, PET or even glass. However, it is appreciated that the DEA can also function without the substrate (30). The use of the substrate is simply to support the DEA for conducting experimental measurements. A cross-section view and a photograph of the DEA are shown in FIGS. 8c and d, respectively.

Typically, the as-synthesised PUA-PEGDA copolymer film from Example 1 (PUA, PUA-PEGDA-5, PUA-PEGDA-10 or PUA-PEGDA-15) with an average thickness of 0.43 mm was placed on an in-house glass holder prepared with a 2 cm×2 cm hole to allow out-of-plane actuation. Carbon grease was used as the electrode, which was coated over a circular area with a diameter of 3 mm on the top and bottom surfaces of the film. Copper tape was used to provide electrical connection to a Unicorn UHP-75 high voltage DC power supply.

Example 4. Static Performance and Temperature Stability of the as-Fabricated DEA The static performance and the temperature stability of the as-fabricated DEA of Example 3 were evaluated to understand the effect of having PUA-PEGDA copolymer films containing various amount of PEGDA on the DEA.

Experimental

The static performances of the as-fabricated DEA were evaluated following the methods as described in General Method 1.

To determine the temperature stability of the DEA, dynamic mechanical analysis (DMA) was performed over a temperature range of −40° C. to 100° C. at a heating rate of 3° C. min$^{-1}$ in a liquid $N_2$ environment. DMA was performed in tension mode in multi-frequency state with a dynamic mechanical analyser (DMA, TA Instrument 329 Q800) according to ASTM D5026.

Area strains were derived from the difference in electrode area before and after actuation. Geometric relations were taken into account by assuming that the electrode region formed a perfect dome during actuation (Carpi, F., et al., Smart Mater. Struct. 2015, 24, 105025). As such, the area strain may be calculated as follows:

$$\varepsilon_{Area} = \frac{(h^2 + r^2)}{h_o^2 + r_o^2} - 1 \quad \text{Equation 1}$$

where $h_o$ is the initial height, $r_o$ is the initial radius of the electrode, h is raised height and r is the radius of the formed dome upon voltage application. In this study, no air bias was applied to cause the actuator to start from a raised height (Ren, Z., et al., *Macromolecules* 2015, 49, 134-140). As such, the initial height of the DEA was assumed to be zero.

Apart from determining the performance of the DEA using area strains, the deflection strains (also known as the deflection-to-thickness ratios) were also characterised in accordance to studies on similar device configurations (Renard, C., et al., *Appl. Polym. Sci.* 2017, 134, 45123; Chen, T., et al., *Soft Mater.* 2015, 13, 210-218).

Results and Discussion

To demonstrate an entirely flexible device, a buckling-mode actuator was set up without any pre-stretching of the elastomer film. Carbon grease was coated on both surfaces with a circular overlapping region, which is defined as the electro-active region.

Figure 9:
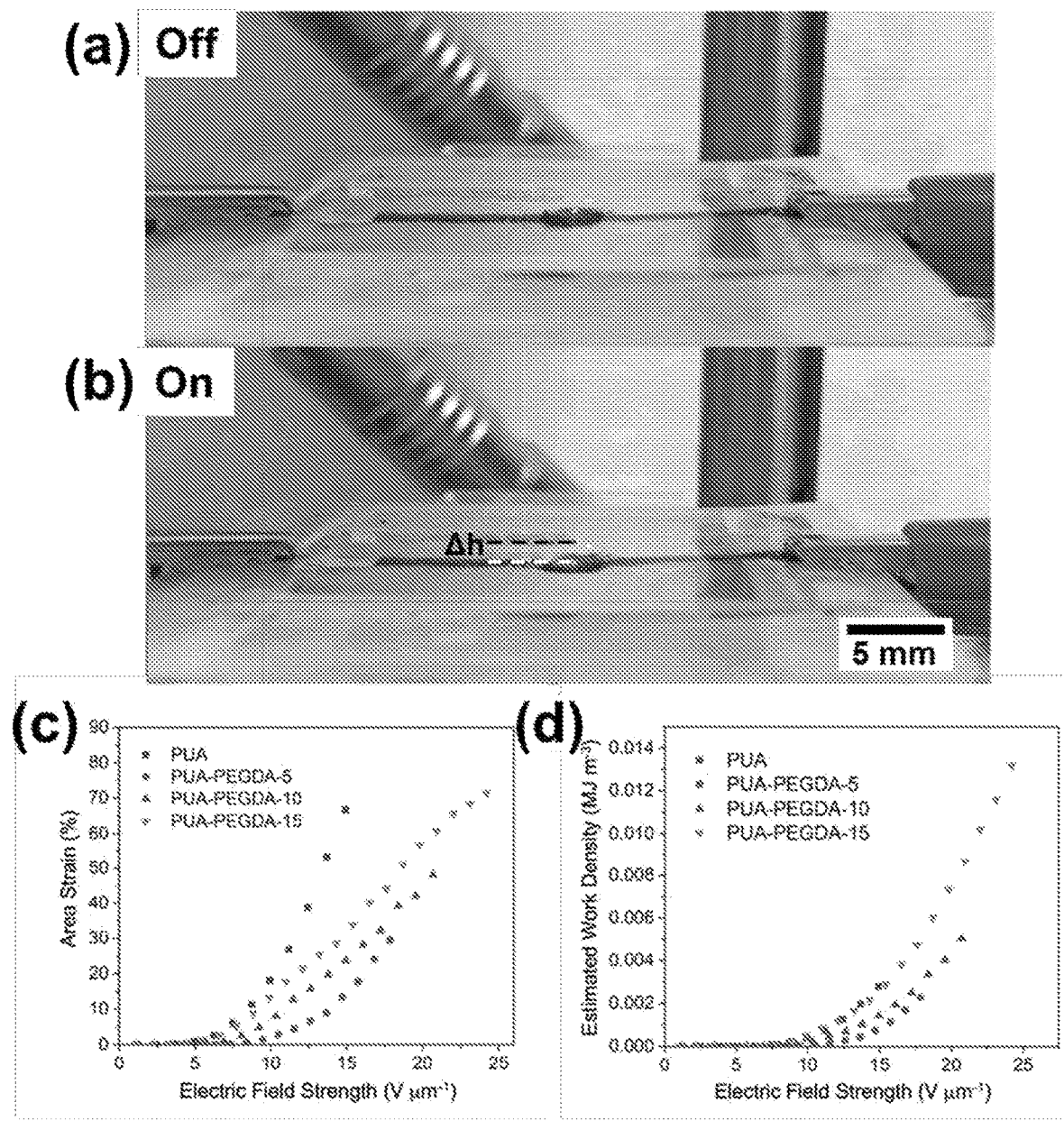
FIG. 9. Depicts the actuation of a single buckling-mode dielectric elastomer actuator (DEA) in the: (a) off state; and (b) on state, where Δh represents the displacement achieved when a voltage is applied; (c) representative area strains of PUA and PUA-PEGDA copolymers (5, 10 and 15 wt % of PEGDA) with increasing electric field strength; and (d) estimated work density based on measured area strains of PUA and PUA-PEGDA copolymers (5, 10 and 15 wt % of PEGDA) with increasing electric field strength.

Typically, buckling of the film occurs as the electroactive region expands against the passive region of the DEA with no overlapping electrodes. This phenomenon creates a boundary condition that suppresses the lateral expansion of the electroactive region and generates a compressive stress across the DEA. When the buckling limit is exceeded, out-of-plane deflection is achieved as the film buckles. The actuated out-of-plane displacement was measured using a laser displacement sensor (FIGS. 9a and b).

Figure 10:
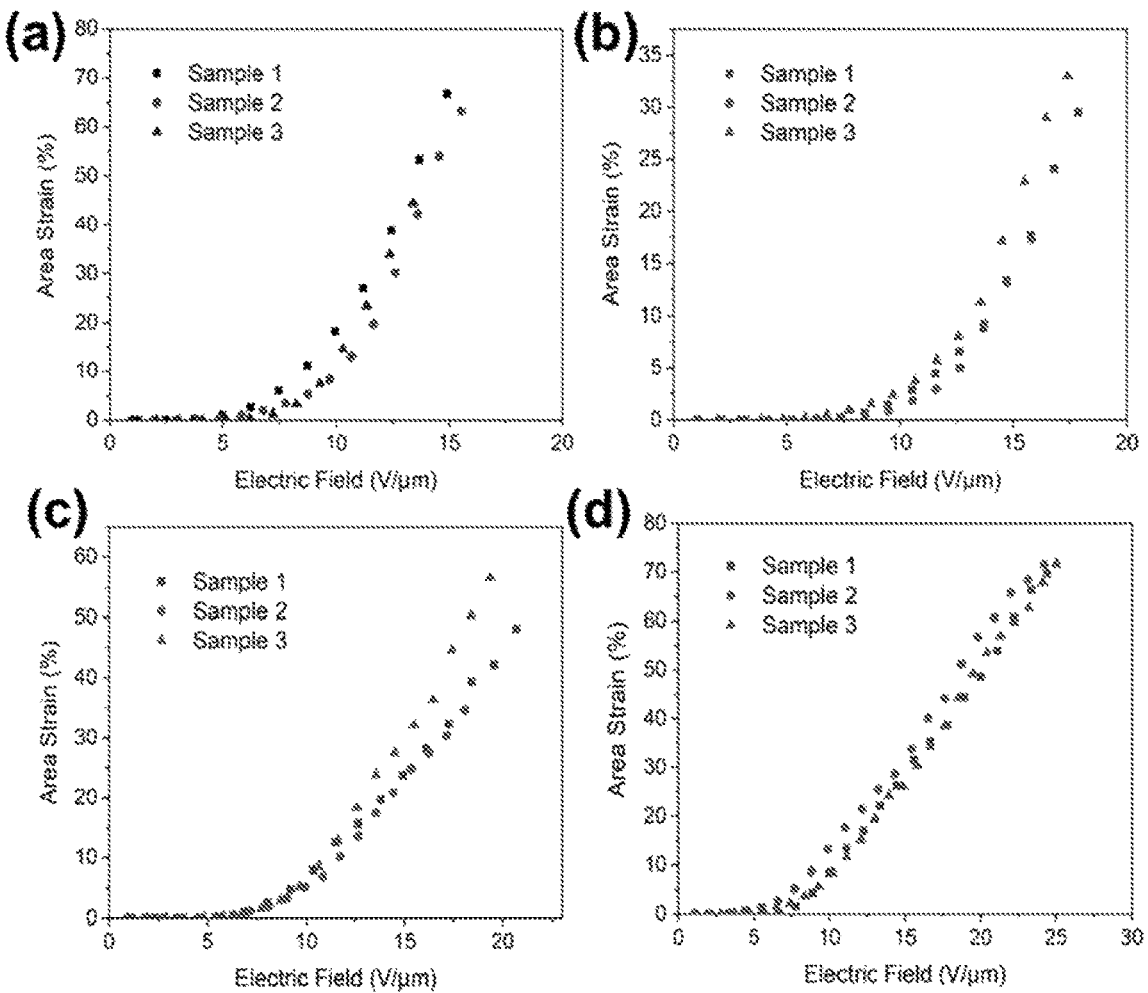
FIG. 10 Depicts the area strains of individual samples of: (a) PUA; (b) PUA-PEGDA-5; (c) PUA-PEGDA-10; and d) PUA-PEGDA-15 with increasing electric field.
Figure 11:
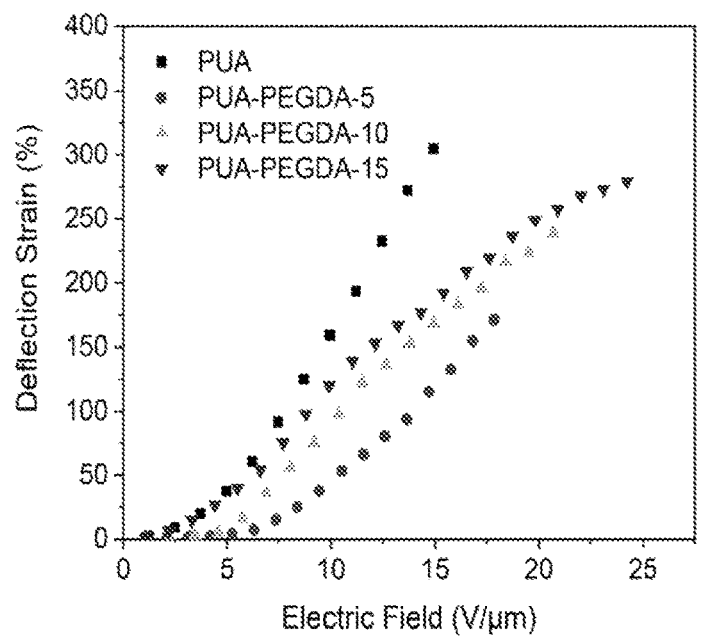
FIG. 11 Depicts a representative deflection strain of PUA and PUA-PEGDA copolymers (5, 10 and 15 wt % of PEGDA) with increasing electric field.

Area strains were determined from changes in the electroactive areas through geometric relations (FIG. 9c, 10a-d), whereas deflection strains were determined based on deflection-to-thickness ratios (FIG. 11). As shown in FIG. 9c and FIG. 10a, the pristine PUA exhibited a sudden increase in area strain before dielectric breakdown, which was not observed in the PUA-PEGDA-5, -10 and -15 copolymers (FIG. 10b-d). This finding was attributed to the non-linear behavior of PUA, for which the modulus became significantly smaller than that of the PUA-PEGDA copolymers beyond 10% strain (FIG. 5a). The early breakdown of PUA was expected without the application of pre-strains to prevent electromechanical instabilities.

In contrast, copolymers with higher concentrations of PEGDA (10 wt % and 15 wt %) showed tolerance beyond the breakdown strength of pristine PUA and PUA-PEGDA-5 (FIGS. 10c and d). This is due to the increase in stiffness from the chemical crosslinks which lowered the likelihood of electromechanical instabilities. With this effect, PUA-PEGDA-10 and PUA-PEGDA-15 were tested at higher electric field strengths to achieve higher maximum strains than PUA or PUA-PEGDA-5. A comparison between the area strains of the DEA materials with no pre-strains is presented in Table 3 below. In comparison to low viscoelastic materials, such as silicone, PUA-PEGDA-15 displayed higher area strains under lower electric field strengths without pre-stretching. This finding can be attributed to the high dielectric permittivity, which led to a higher generated Maxwell pressure. It was also observed that the deflection strain of the PUA and PUA-PEGDA copolymers followed similar trends of the area strains.

TABLE 3

Comparison of area strain between various DEA materials without pre-strains.

| Entry | Materials | Area strain (%) | Electric field (V µm$^{-1}$) | Dielectric constant (at 1 kHz) | Reference |
|---|---|---|---|---|---|
| 1 | PUA | 66.7 | 14.9 | 5.5 | Current invention |
| 2 | PUA-PEGDA-15 | 71.4 | 24.2 | 9.4 | Current invention |
| 3 | CCTO@PANI/PDMS | 13.24 | 10 | ~4.25 | a |
| 4 | Azo-g-PDMS | 17 | 68 | 4.64 | b |
| 5 | SiR-DN 2/1 | 12 | 15.7 | ~10 | c |
| 6 | c-P(BA-GMA)-3 | 52.1 | 21.6 | 5.67 | d |
| 7 | VHB 4910 | 7.5 | 17 | 4.2 | e |
| 8 | TPU$_{80}$ | 2.3 | 42 | 5.1 | f |
| 9 | PUU-HS-13 | ~18 | 40 | 7.2 | g | a Zhang, Y. Y., et al., Polym. Compos. 2019, 40, E62-E68.
b Zhang, L., et al., J. Mater. Chem. C 2015, 3,4883-4889.
c Sun, H., et al., Polym. Chem. 2019, 10, 633-645.
d Zhao, Y., et al., Polymer 2018, 137, 269-275.
e Shankar, R., et al., Macromol. Rapid Commun. 2007, 28,1142-1147.
f Renard, C., et al., RSC Adv. 2017, 7, 22900-22908.
g Xiang, D., et al., RSC Adv. 2017, 7, 55610-55619.

Under an isochoric assumption, the work density ($u_e$) of the material was calculated as the work done by the actuator divided by its volume (as shown in Equation 2 below), where P represents the generated Maxwell pressure and $s_z$ is the thickness strain determined from the measured area strains (Ha, S. M., et al. *Proc. SPIE,* 2008, 6927, 69272C).

$$u_e = -1/2 P \ln(1+s_z) \qquad \text{Equation 2}$$

As shown in FIG. 9d, the reduction in the work density that arose from the increased crosslinking with increasing PEGDA concentration was gradually minimised. At electric field strengths of up to 15 V µm$^{-1}$, the work density of PUA-PEGDA-15 was similar to that of the pristine PUA sample, indicating an optimum balance between the effects of the increased dielectric constant and the elastic modulus. Furthermore, as PUA-PEGDA-15 could be tested at higher electric field strengths, the maximum work density achieved by PUA-PEGDA-15 was the highest among the measured samples. As such, this evidently shows the effectiveness of polar crosslinks in increasing the load that the actuators are capable of driving.

Figure 12:
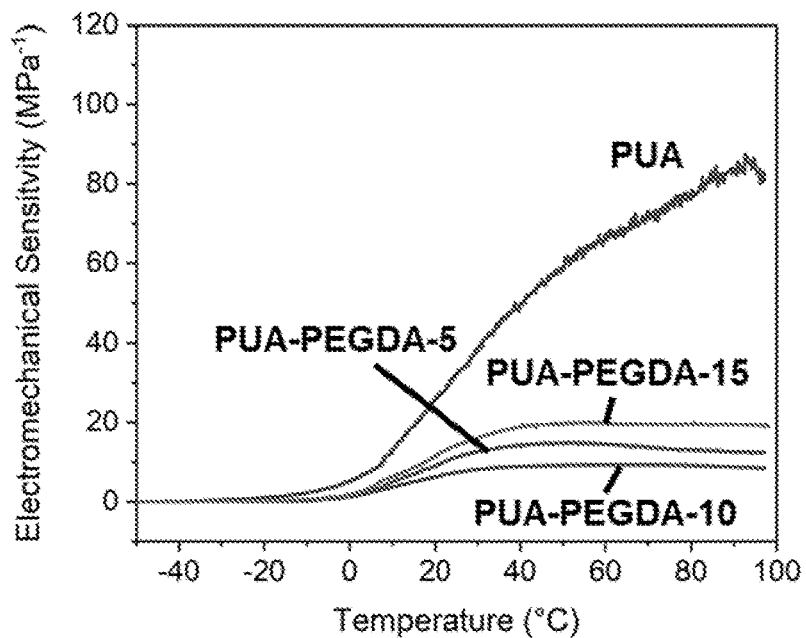
FIG. 12 Depicts the electromechanical sensitivity of PUA and PUA-PEGDA copolymers (5, 10 and 15 wt % of PEGDA) as a function of temperature from −40° C. to 100° C.

To illustrate the temperature dependent behaviour of the DEAs, the electromechanical sensitivity was determined as a function of temperature (FIG. 12). Here, the electrochemical sensitivity (or stability) is defined as the ratio between the dielectric constant at 1 kHz and the storage modulus (Zhao, H., et al., *Appl. Phys. Lett.,* 2015, 106, 092904; Sheng, J., et al., *J. Macromol. Sci. B,* 2012, 51, 2093-2104). It is evident that the PUA without the addition of the polar crosslinks, showed poor temperature stability, which spanned close to two orders of magnitude from −40° C. to 100° C. This can be attributed to the increased motion of the polymer chains with temperature. With the introduction of PEGDA, this molecular motion was restricted, therefore resulting in more stable electromechanical sensitivity over a wide temperature range.

Example 5. Dynamic Performance of the DEA of the Current Invention

The dynamic performance of the as-fabricated DEA of Example 3 was next evaluated to understand the effect of having PUA-PEGDA copolymer films containing various amount of PEGDA. The dynamic performance of the as-fabricated DEA was evaluated following the methods as described in General Method 1.

Results and Discussion

DEA Fabricated from Initial Batch of PUA-PEGDA Copolymer Films

To evaluate the actuation/dynamic properties of the buckling DEA of the current invention, the vertical displacement motion recorded by a laser sensor was first normalised by removing the drifting effects from the equilibrium position and taking the average displacement achieved over 30 cycles. When a voltage was applied to the DEA, the copolymer film sank downwards at the overlapping circular area of the electrodes as shown in the photographs of the DEA in FIG. 13a.

In addition, it is also possible to allow the actuator to rise upwards—this can be achieved through the use of air pressure below the inactive film to create a dome shape, therefore directing the displacement upwards. Alternatively, the actuator may also be configured to rise upwards without external assistance (air pressure). This is achieved by the use of asymmetric electrodes (i.e. made of different materials etc), whereby the top and bottom electrodes have difference mechanical properties. When a voltage is applied, out-of-plane actuation will occur towards the softer side.

Figure 14:
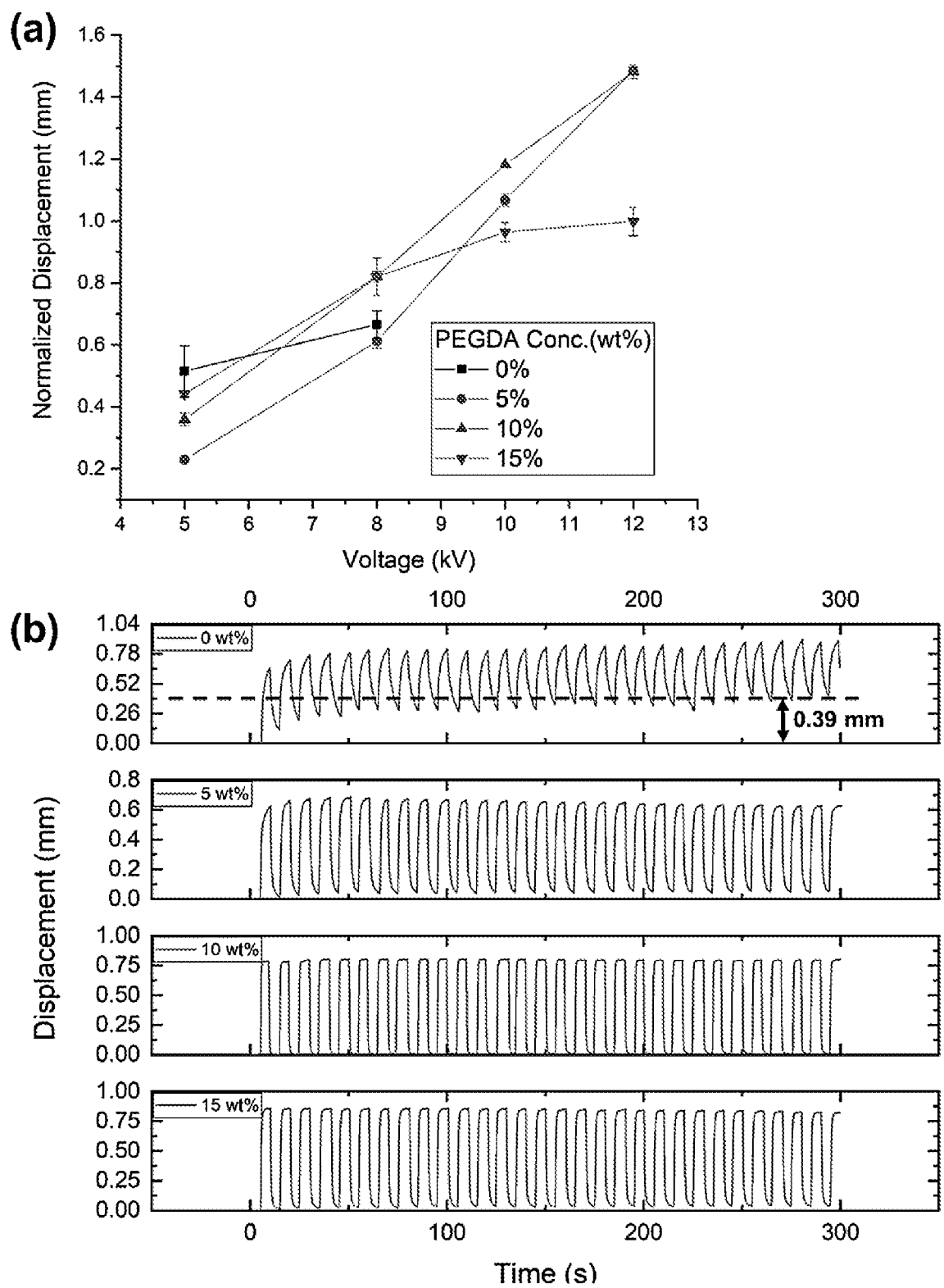
FIG. 14 Depicts: (a) the normalised displacement versus applied voltage of the DEA fabricated from the initial batch of PUA-PEGDA copolymer films (0, 5, 10 and 15 wt % of PEGDA); and (b) the vertical deflection of the initial PUA-PEGDA copolymer films (0, 5, 10 and 15 wt % of PEGDA) against time in response to an applied voltage of 8 kV at 0.1 Hz.

The normalised displacement as a function of the applied voltage for copolymer films with different concentrations of PEGDA is as shown in FIG. 14a. It was observed that with a higher applied voltage, a greater vertical displacement was achieved. This was due to a larger Maxwell pressure on the DEA at higher voltages, which induced a greater displacement. In addition, unlike the pristine PUA film, the PUA-PEGDA copolymer films were tested beyond 8 kV without experiencing dielectric breakdown. When dielectric breakdown occurs, current is able to flow through the polymer film causing the film to become conductive and unable to actuate. This improvement of the DEA with the use of PUA-PEGDA copolymer films may be attributed to the increase in the elastic modulus of the copolymer films due to chemical crosslinking. For PUA-PEGDA-5 and -10, it was observed that an average displacement of up to 1.5 mm was obtained, which was larger than the minimum skin deformation required for detection in haptic devices.

Further, it was observed that minimal actuation drift from equilibrium occurred for the DEA made from the PUA-PEGDA copolymer films which was significantly lower than that of the pristine PUA (FIGS. 13b and 14b), and the VHB polymer (L. Lei, et al., Smart Mater. Struct., 2014, 23, 025037). The minimal actuation drift along with the rapid response times can be attributed to the reduction of the viscoelastic nature of the polymer through chemical crosslinking. With an increase in chemical crosslinking, molecular mobility was restricted as it was hindered by adjacent molecules or functional groups, which reduced the viscoelasticity of the copolymers.

Figure 15:
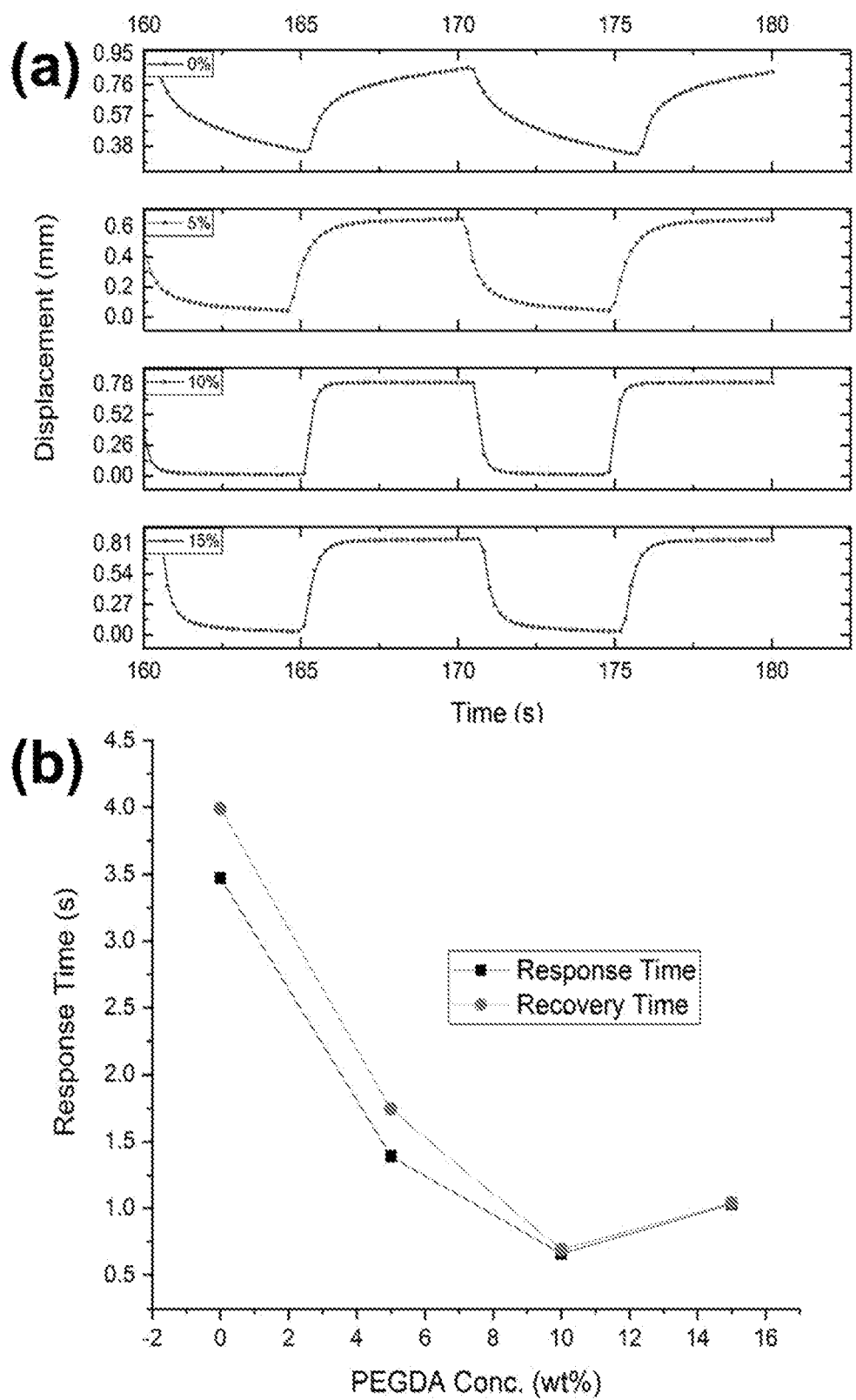
FIG. 15 Depicts: (a) profiles of a single cycle of the strain response of the DEAs (made from initial batch of PUA and PUA-PEGDA copolymers (0, 5, 10 and 15 wt % of PEGDA)) performed at a 10 V μm$^{-1}$ electric field at 0.1 Hz; and (b) response time and recovery time of the DEAs (made from initial batch of PUA and PUA-PEGDA copolymer films (0, 5, 10 and 15 wt % of PEGDA)) when a voltage was applied and removed, respectively.
Figure 16:
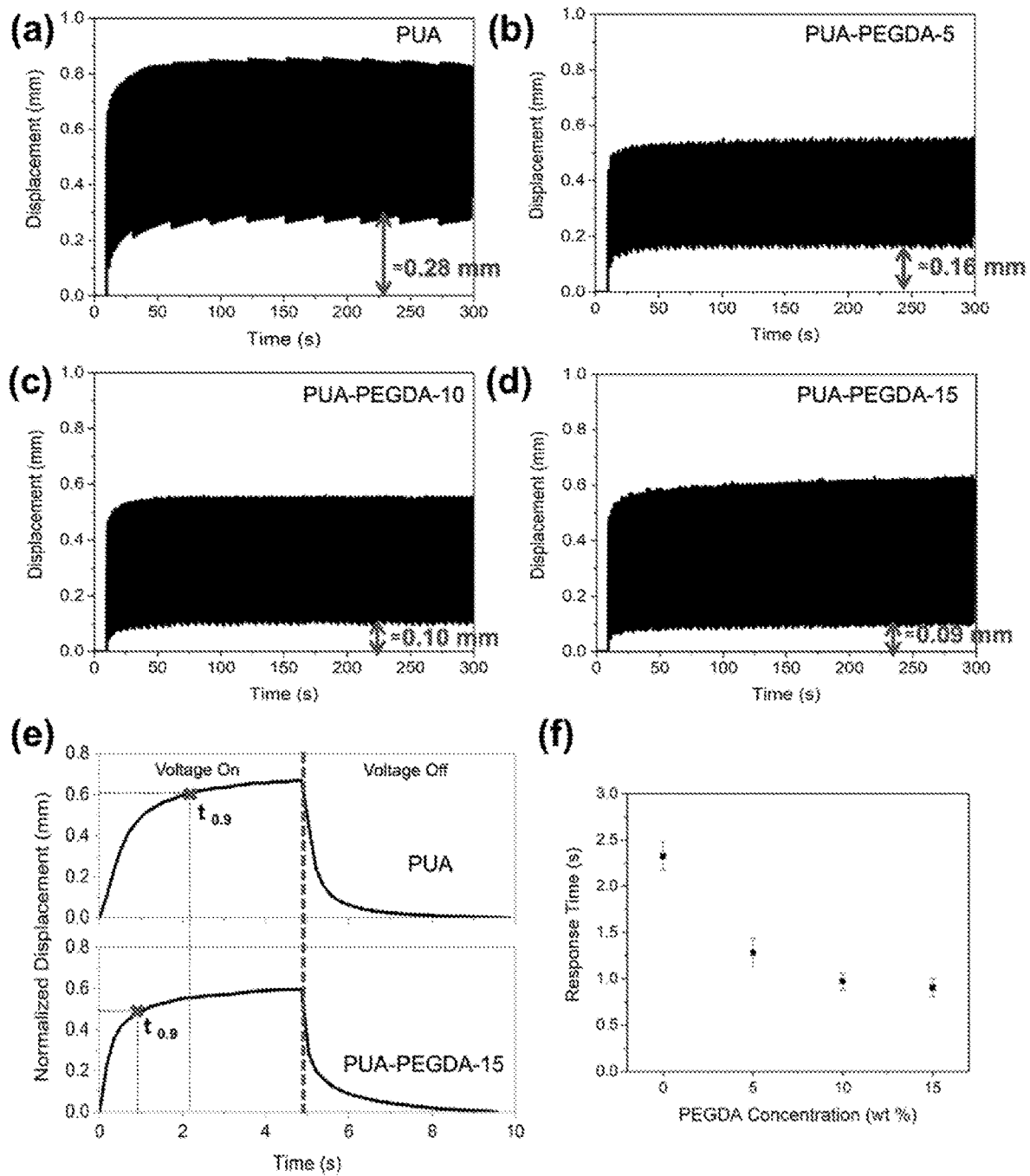
FIG. 16 Depicts: (a-d) the first 145 cycles of the cyclic test performed at an electric field strength of 10 V μm$^{-1}$ at a frequency of 0.5 Hz, for DEAs made from subsequent batches of PUA, PUA-PEGDA-5, PUA-PEGDA-10 and PUA-PEGDA-15, respectively. The approximate drift distance after 145 cycles was indicated in each figure; (e) profile of a single cycle of the strain response of PUA and PUA-PEGDA-15 under a 10 kV μm$^{-1}$ electric field at 0.1 Hz showing the difference in response time, $t_{0.9}$. This response time $t_{0.9}$ represents the time for the DEAs to reach 90% of its maximum displacement at 0.1 Hz; and (f) response time ($t_{0.9}$) of DEAs fabricated with subsequent copolymer films of various PEGDA concentrations (0, 5, 10 and 15 wt %).
Figure 17:
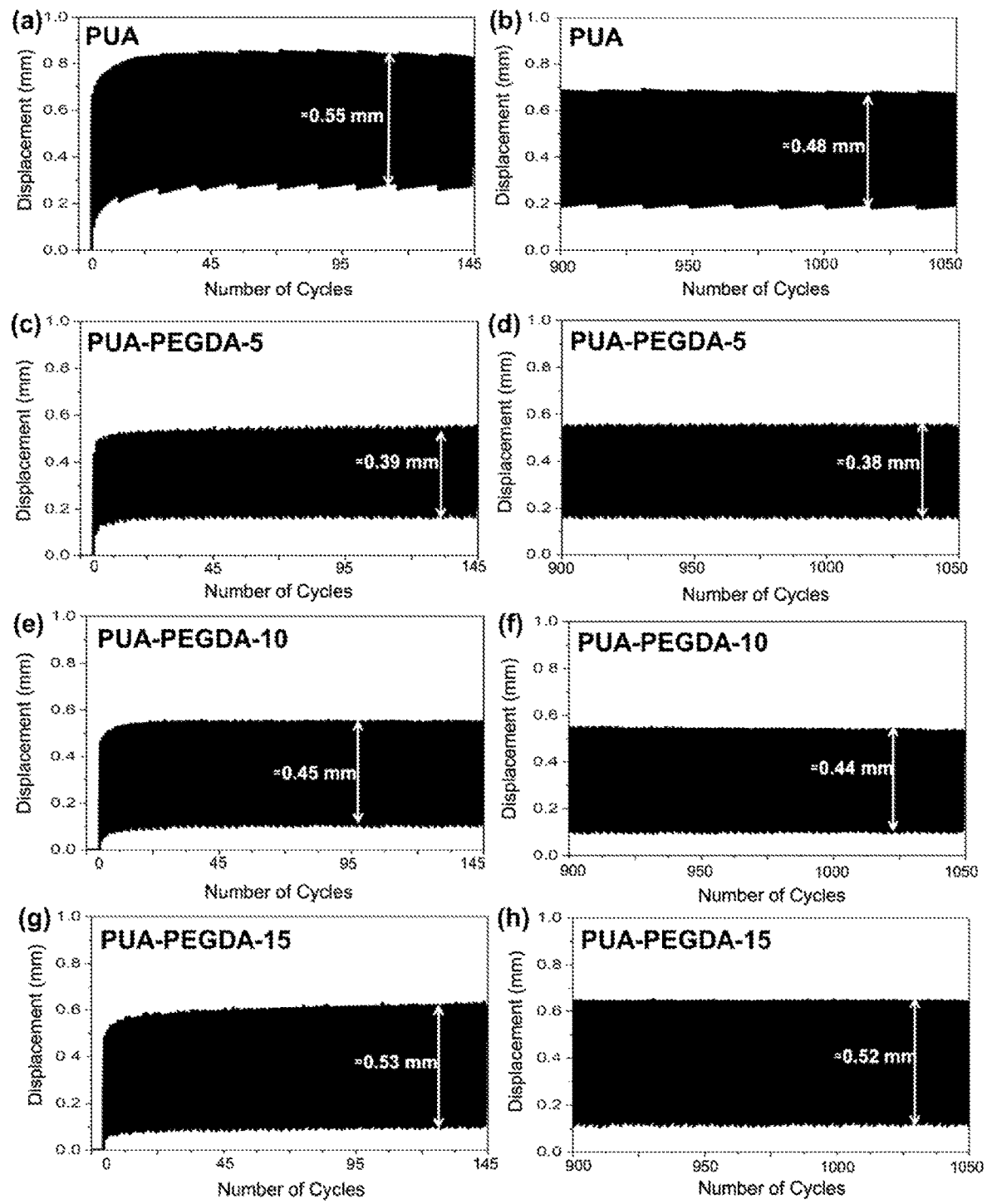
FIG. 17 Depicts the cyclic lifetime test performed at an electric field of 10 V μm$^{-1}$ at a frequency of 0.5 Hz for 1050 cycles (0 to 145 cycles, and 900 to 1050 cycles), for DEAs made from subsequent batches of: (a, b) PUA; (c, d) PUA-PEGDA-5; (e, f) PUA-PEGDA-10; and (g, h) PUA-PEGDA-15. Approximate displacements achieved are indicated in each figure.

In addition, the increase in the elastic modulus may suppress electromechanical instability by preventing the excessive thinning of the elastomer that may result in the dielectric breakdown, as the electric field across the film increased rapidly. This enhancement to the pristine film also led to the achievement of vertical displacements of up to 1.5 mm. To quantify the response time of the actuator, the time taken to reach 90% of the maximum peak for each cycle was recorded. Further, the creep recovery time was determined as the time taken to reach 90% of the minimum value for each cycle. From the respective cyclic profiles in FIG. 15a, PUA-PEGDA copolymer film showed a significant improvement in the response and recovery times with PUA-PEGDA-10 achieving the fastest speed of 0.66 s and 0.69 s, respectively. This represents a drastic improvement over the pristine PUA film with response and recovery times of about 3.5 s and 4.0 s, respectively, and the commonly used VHB polymer with a strain response that continues to increase after 3 mins. Notably, the response and recovery times of PUA-PEGDA-5 were improved by at least five times in comparison to the pristine PUA (FIG. 15b).

DEA Fabricated from Subsequent Batch of PUA-PEGDA Copolymer Films

The dynamic performance and endurance of the buckling-mode DEA fabricated from subsequent batch of PUA-PEGDA copolymer films were evaluated through cyclic tests performed at a frequency of 0.5 Hz for 1050 cycles. To evaluate the effects of the viscoelastic drift, the first 145 buckling cycles for all of the DEAs described above were studied (FIG. 16a-d). The subsequent cycles are shown in FIG. 17a-h. The DEA fabricated with PUA and PUA-PEGDA-5 were observed to gradually drift from their equilibrium position by a large amount (>0.15 mm) before reaching a stable state. Such behaviour is the result of the inherent viscoelastic characteristics of the film, wherein the relaxation time is slower than the cycling time, and the energy is dissipated from the sliding of the polymer chains across each other. Similar behaviors have been observed in elastomers (for e.g. VHB polymers) with high viscoelasticity.

The introduction of PEGDA as chemical crosslinks, which anchored the polymer chains to reduce molecular motion, resulted in better thermal stability (FIG. 12), faster relaxation time and minimal drift of the DEA. These findings are evident in FIG. 16a-d, which show that the viscoelastic drift decreased significantly for the PUA-PEGDA-15 sample as compared to that of PUA. At the end of 145 cycles, PUA drifted a distance of 0.28 mm from its initial start point, whereas PUA-PEGDA-15 drifted a distance of only 0.09 mm. With reduced viscoelastic drift, better location precision can be obtained.

In addition, by tuning the viscoelastic nature of the polymer films, the response times of the actuator can also be controlled. To allow sufficient time for the peak displacement to be reached, the voltage was applied at 0.1 Hz. The response time $t_{0.9}$ of the actuator was quantified as the time taken to reach 90% of the maximum displacement for each cycle. From FIG. 16f, PUA-PEGDA-15 achieved a response time of less than one second, which was an improvement compared to PUA. This finding was also corroborated by the reduced hysteresis loss tested (Example 2, FIG. 7). The strain response (FIG. 16e) of the as-synthesised PUA-PEGDA-15 is analogous to that of silicones with higher elastic properties, lower dissipative energy and a faster response time.

As noted above, the response times achieved for the PUA-PEGDA materials disclosed here can be reduced by more than 50% compared to PUA alone. Given that 90% of the maximum amplitude can be reached in less than a second, along with stable and reliable performance (due to a significant reduction in viscoelastic drift with increasing PEGDA concentration), allows the buckling actuators to be used in a wide array of high precision applications. These include, but are not limited to, tunable lenses and gratings.

Example 6. Properties of a DEA Mounted on a Flexible Substrate

Figure 18:
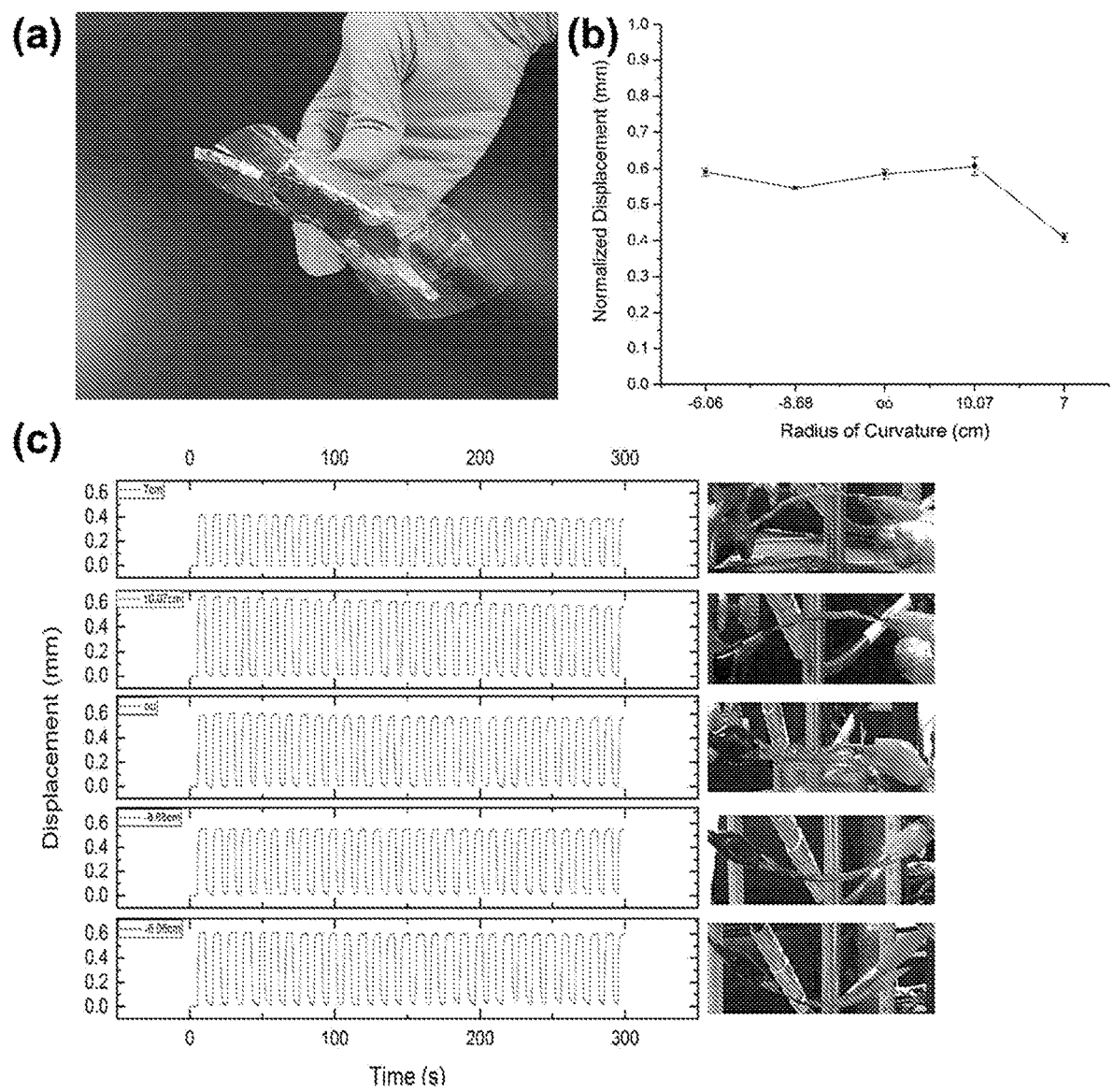
FIG. 18 Depicts: (a) a photograph of a flexible DEA fabricated using a PUA-PEGDA-10 copolymer film (with carbon grease electrodes) mounted on a flexible PET substrate; (b) normalised displacement versus different radius of bending of the flexible DEA; and (c) displacement of the flexible DEA under different radius of bending for over 30 cycles.

The PUA-PEGDA copolymer was mounted onto a flexible substrate for the fabrication of a fully flexible DEA (FIG. 18a). In this study, the as-synthesised PUA-PEGDA-10 copolymer film was used, while a polyethylene terephthalate (PET) substrate was used as substrate 30 (in FIG. 8b). Nonetheless, it should be noted that the DEA will be able to operate without the substrate. Typically, a PET substrate with a hole larger than the electrode area, but smaller than the dielectric elastomer, was used for mounting the DEA. The hole was created to prevent the dampening of the vertical displacement of the DEA during actuation. Adhesive tape (3M VHB Adhesive Tape F9473PC) was used to adhere the dielectric elastomer layer onto the substrate.

The as-fabricated DEA was subjected to various bending radii ranging from about −6 cm (downward bending) and up to 7 cm (upward bending) as shown in FIG. 18c. From FIG. 18c, it was observed that the actuator remained functional with minimal drift from its equilibrium position and displayed stable actuation over 30 cycles. Surprisingly, the PUA-PEGDA-10 copolymer films, despite being bent upwards, continued to buckle downwards, which is different from reports that used a geometric support to create a pre-curvature to promote uniaxial buckling (R. Vertechy, et al., *Smart Mater. Struct.*, 2012, 21, 094005). In addition, from FIG. 18b, based on the normalised displacement over 30 cycles, the bending radius was found to have minimal degradation on the performance of the device with a maximum displacement reduction of around 30% found from the tested samples after continuous cycling. In addition, it is also possible to allow the actuator to rise upwards via the use of air pressure below the inactive film to create a dome shape, which directs the displacement upwards, or as described above in Example 5. Therefore, the PUA-PEGDA copolymer films and DEA configuration were demonstrated to be highly stable and mechanically deformable, making them highly suitable for shaping for soft robotics applications.

The above demonstrates the use of PUA-PEGDA copolymers in a buckling actuator without rigid components via mounting of the copolymer on a flexible PET substrate. Further, when the substrate was bent, the out-of-plane actuation was still observable which suggests the potential use of such actuator in haptic devices.

Example 7. Fabrication of a Dielectric Elastomer Actuator Array with Selective Actuation and its Integration onto a Wearable Device Previous Examples 3-6 have shown the fabrication of a DEA that provides actuation at a single localised area. To demonstrate the feasibility of actuation at selected multiple points, a DEA array comprising an array of electrodes via a cross-junction configuration was fabricated (FIGS. 19a and b).

Figure 19:
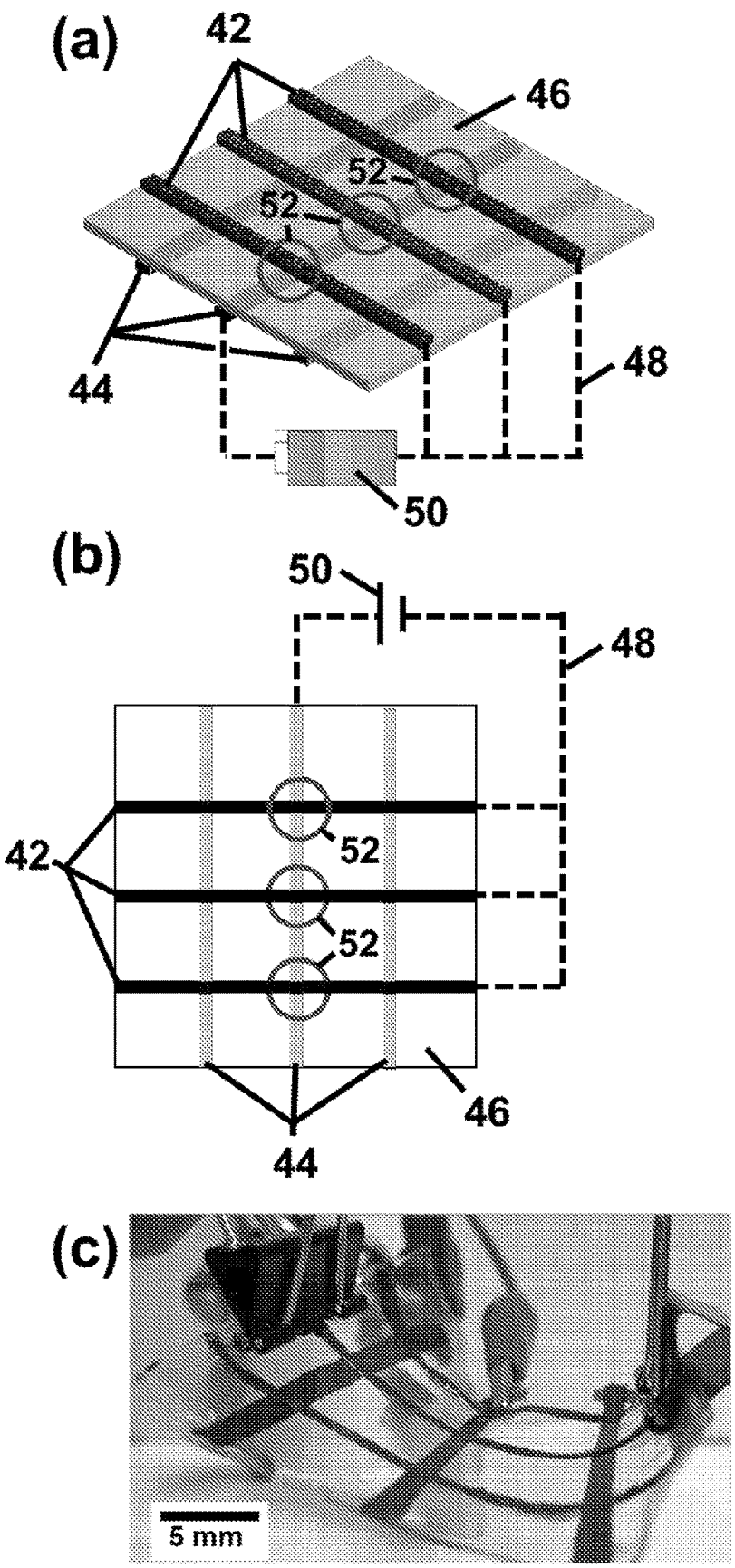
FIG. 19 Depicts: (a) a schematic representation of the as-fabricated DEA array with multiple electrodes in a cross-junction configuration. Electrical connections are connected to activate the middle three regions at 52; (b) a top view showing the arrangement of the DEA array; and (c) a demonstration of the as-fabricated DEA using PUA-PEGDA-15 copolymer film in operation. The electrical connections are connected in a manner such that the middle junctions are being activated. The array was subjected to an electric field of 12 V μm$^{-1}$ at approximately 0.4 Hz.

In the setup as shown in FIGS. 19a and b, three carbon grease electrodes (42, 44) were applied to each of the top and bottom surfaces of the PUA-PEGDA copolymer film (46), such that the top and bottom electrodes were perpendicular to each other. To provide selective actuation, the top three electrodes (42) and a bottom middle electrode were connected via electrical connection (48) to a current source (50). The overlapped regions at 52 are the electro-active regions where electric current is applied and where actuations can be effected. In addition, the fabricated actuator array with a cross-junction configuration can be fabricated on a flexible PET substrate (without a rigid frame or pre-stretching) as shown in FIG. 19c.

Figure 20:
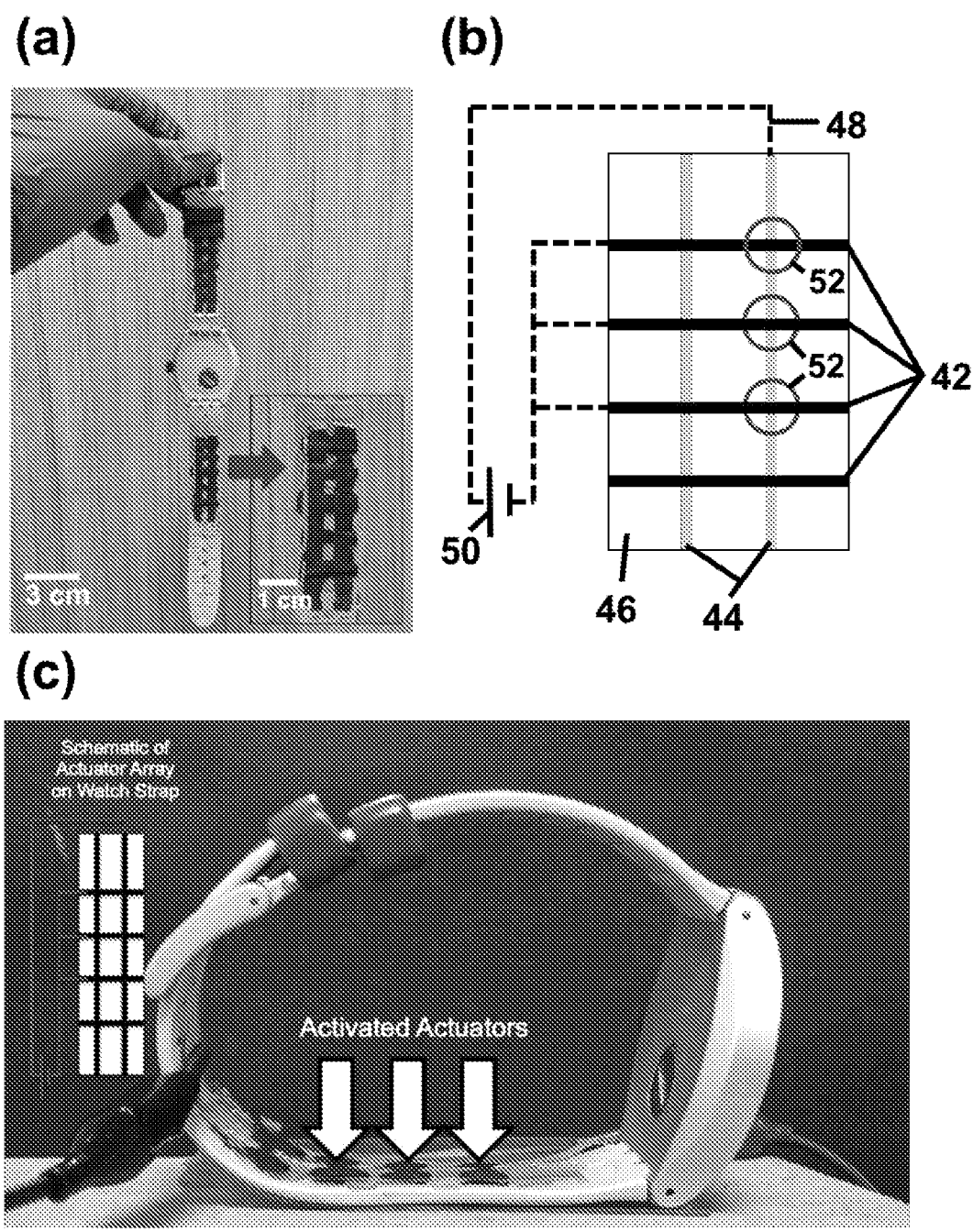
FIG. 20 Depicts: (a) integration of the as-fabricated DEA array onto a watch strap to provide haptic feedback for wearables; (b) a top view showing the arrangement of the DEA array such that selected actuations are at the overlapping cross-junctions (52) between the top and bottom electrodes under electrical connection; and (c) demonstration of haptic feedback using the as-fabricated DEA array using the PUA-PEGDA-15 copolymer film.

In addition, the integration of the fabricated actuator array into a watch strap to provide haptic feedback for wearables is shown in FIG. 20a-c. A schematic arrangement of the fabricated actuator array is shown in FIG. 20b. The arrangement is similar to that of FIG. 19b, but with four top electrodes (42) and two bottom electrodes (44), and with electrical connection (48) made to the selected electrodes.

Example 8. Fabrication of a Transparent Dielectric Elastomer Actuator (DEA) Using Silver Nanowire as the Electrodes Other than using carbon grease as electrodes, silver nanowires were also used as electrodes for fabricating the DEA of the current invention.

Typically, silver nanowires (average diameter of 50 nm and length of 100-200 μm) with a concentration of 0.5 mg/mL (dispersed in isopropyl alcohol) were spray coated onto a PUA-PEGDA copolymer film on the top and bottom surfaces.

Figure 13:
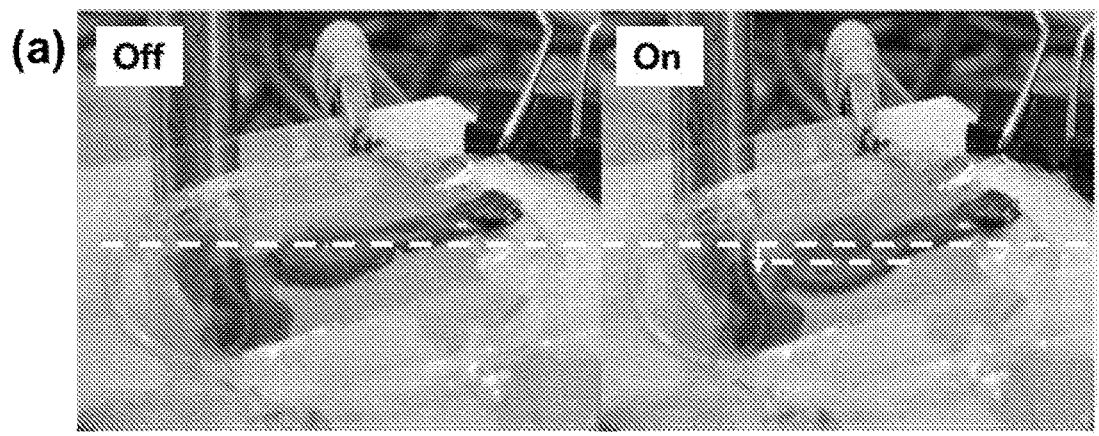
FIG. 13 Depicts: (a) photographs of DEA fabricated with the initial batch of PUA-PEGDA-10 copolymer film with carbon grease electrodes in the on and off state. The dash lines indicate the initial position of the laser spot in the "off" state, while the bottom dash line in the photograph of the "on" state indicates the final position of the film; and (b) vertical deflection against time in response to an applied voltage of 8 kV at 0.1 Hz for the initial PUA-PEGDA-10 of the as-fabricated DEA.
Figure 13:
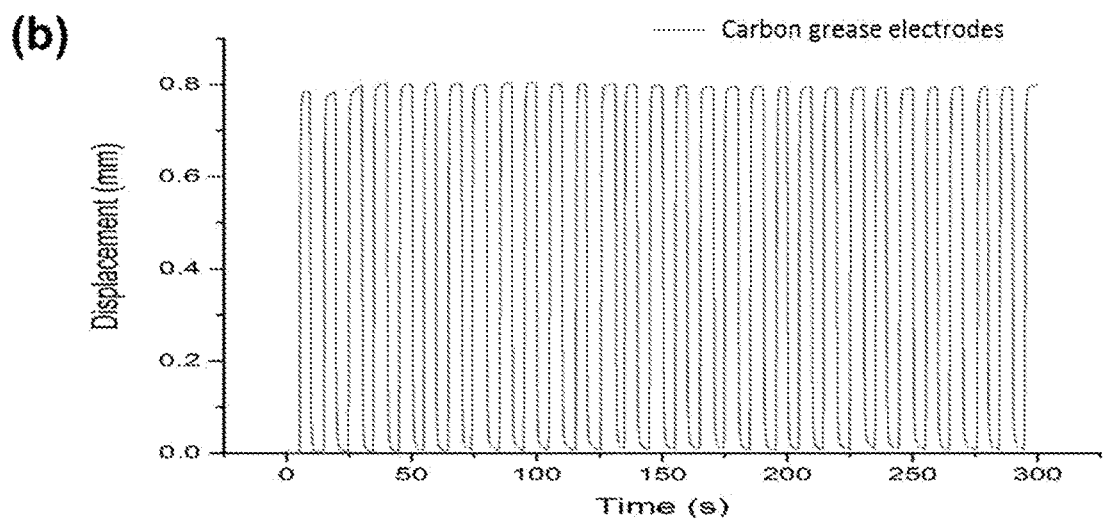
Figure 21:
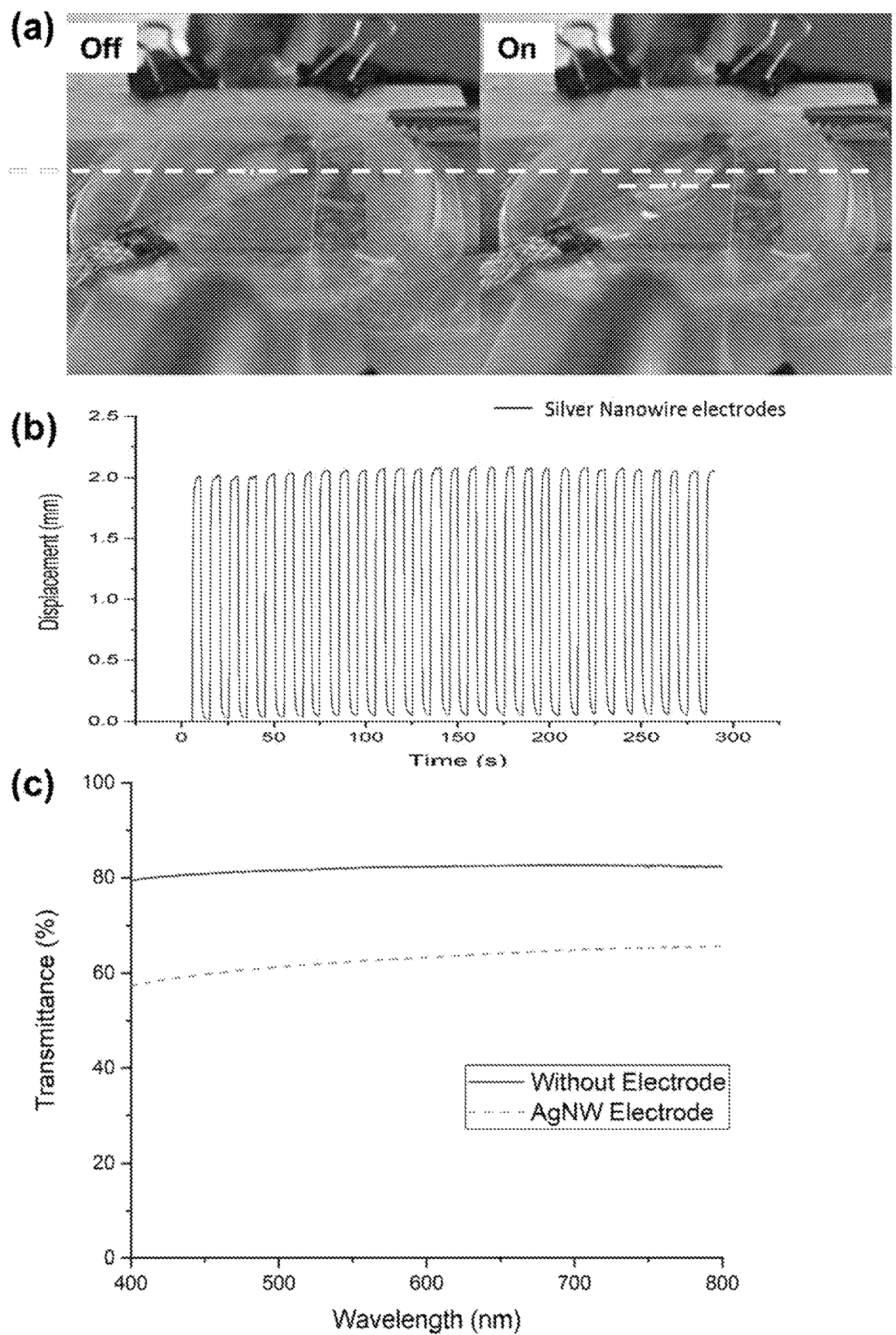
FIG. 21 Depicts: (a) photographs of DEA fabricated with the PUA-PEGDA-10 copolymer film with silver nanowires electrodes in the on and off state. The dash lines indicate the initial position of the laser spot in the off state, while the bottom dash line in the photograph of the "on" state indicates the final position of the film; and (b) vertical deflection against time in response to an applied voltage of 8 kV at 0.1 Hz for the initial PUA-PEGDA-10 of the as-fabricated DEA; and (c) optical transmittance of PUA-PEGDA copolymer film with and without the silver nanowire electrodes at the visible light range of 400-800 nm.

The photograph of the device under actuation is shown in FIG. 21a, while the performance of the transparent actuator is shown in FIG. 21b. The transparent device displayed larger actuation properties (i.e. displacement) as compared to the actuator coated with carbon grease electrodes (FIG. 21b vs. FIG. 13b). This was probably due to the lighter weight and higher conductivity of the spray coated silver nanowire electrodes as compared to carbon grease electrodes, which provided a more effective electric field distribution across the film, therefore enhancing the performance of the DEA.

From FIG. 21a, it was observed that the silver nanowire electrodes are generally transparent (with good optical transmittance) which may be useful for integrating the DEA onto wearables as the electrodes appear to be less conspicuous (as compared to carbon grease electrodes). Further, such transparent electrodes provide less optical interference to other optical techniques and can allow other features which require light to be integrated into the DEA or the wearables easily. The optical transmittance of the PUA-PEGDA copolymer film with and without the silver nanowires as a function of the wavelength in the visible light range of 400-800 nm is shown in FIG. 21c. With the spray-coated silver nanowires, the fabricated transparent DEA displayed an average optical transmittance of 62.7% (about 19% decrease as compared to PUA-PEGDA copolymer film without electrode).

Example 9. Comparison of the Mechanical Properties of the as-Synthesised PUA-PEGDA Copolymer Films Made with PEGDA Having Different Number Average Molecular Weight ($M_n$)

To understand the effect of number average molecular weight ($M_n$) of PEGDA on the mechanical properties of PUA-PEGDA copolymer films, PUA-PEGDA copolymer films made with PEGDA having $M_n$ of 575 and 2000 Daltons, respectively, were synthesised. In this study, the amount of PEGDA was kept at 15 wt % and the copolymer films synthesised using PEGDA with $M_n$ of 575 and 2000 Daltons are denoted as "PUA-PEGDA-15" and "PUA-PEGDA(2000)-15", respectively.

Experimental

PUA-PEGDA-15 copolymer film was synthesised according to the method described in Example 1. For PUA-PEGDA(2000)-15, PUA (CN9021) was first mixed with 15 wt % of PEGDA ($M_n$=2000 Daltons), followed by the addition of 1 wt % of AIBN with the mixture mixed thoroughly. To ensure that the PEGDA was dissolved and mixed with CN9021, acetone was added at a weight ratio of 1:2 (CN9021:acetone) to the mixture and stirred. Thereafter, the mixture was cast, degassed and finally heated at 90° C. for 1 hr in an inert environment. Tensile tests were carried out as described in Example 2, with a strain rate of 3.33 mm s$^{-1}$.

Results and Discussion

Figure 22:
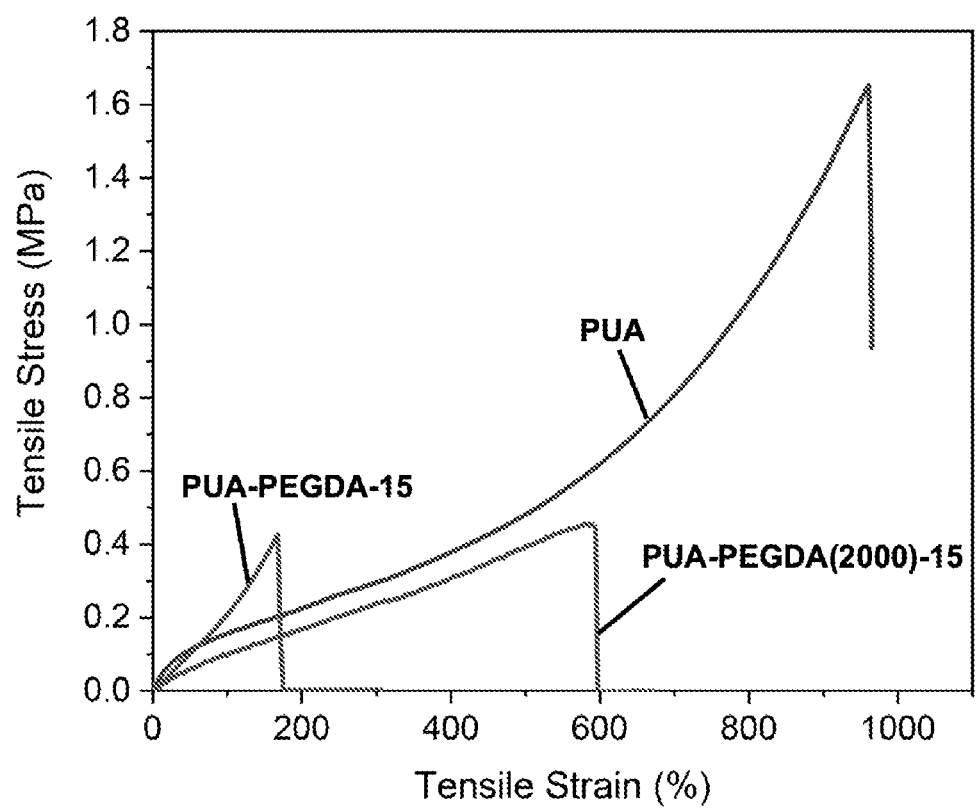
FIG. 22 Depicts the stress-strain curves of PUA, PUA-PEGDA-15 and PUA-PEGDA(2000)-15 copolymer films determined from a standard tensile test at a strain rate of 3.33 mm s$^{-1}$.

As shown in FIG. 22, the mechanical properties of the PUA-PEGDA copolymer films differed significantly when PEGDA of different $M_n$ were used. PUA-PEGDA(2000)-15 obviously showed a reduction in modulus when compared to PUA-PEGDA-15 and PUA, indicating a softer material was formed. The difference in modulus can be attributed to the reduced number of reactive acrylate groups in PEGDA ($M_n$ of 2000 Daltons) as compared to the same amount of PEGDA with $M_n$ of 575 Daltons. As such, this reduced the effectiveness of PEGDA (with higher $M_n$) to behave as a crosslinker and therefore, resulting in its failure to reduce the viscoelasticity of the dielectric elastomer. Given this, the use of PEGDA with lower $M_n$ is preferred (i.e. 200 to 1000 Daltons). The mechanical properties of the as-synthesised polymer films made with PEGDA having different $M_n$ are as shown in Table 4.

TABLE 4

Comparison of the mechanical properties of the as-synthesised PUA-PEGDA copolymer films made with PEGDA having different number average molecular weight ($M_n$).

| Materials | Break tensile strength [MPa] | Elongation at break [%] | $Y_{10\%}$[a] [MPa] | $Y_{50\%}$[b] [MPa] |
|---|---|---|---|---|
| PUA | 1.65 | 960 | 0.337 | 0.100 |
| PUA-PEGDA-15 | 0.42 | 168 | 0.323 | 0.168 |
| PUA-PEGDA(2000)-15 | 0.52 | 590 | 0.210 | 0.080 |

[a]Apparent modulus at 10% strain calculated from stress-strain curve.
[b]Apparent modulus at 50% strain calculated from stress-strain curve.

The invention claimed is:

1. A buckling actuator, comprising:
    a first electrode;
    a second electrode; and
    a film of a dielectric elastomeric material having a first surface and a second surface sandwiched between the first and second electrodes, the material formed by the random block copolymerisation of:
        a polymeric material comprising silicon or nitrogen atoms that has two or more acrylate or vinyl end groups; and
        a polar polymeric material having two or more acrylate or vinyl end groups
    wherein:
        the first electrode is arranged to cover a first electrode area on the first surface of the film of dielectric elastomeric material and the second electrode is arranged to cover a second electrode area on the second surface of the film of dielectric elastomeric material, such that there is a region of overlap between the first and second electrode areas that has an area that is smaller than an area of the first or second surfaces of the film of dielectric elastomeric material.

2. The actuator according to claim 1, wherein the first and second electrode areas each occupies an area of from 5% to 50% on the first and second surfaces of the film of dielectric elastomeric material, respectively.

3. The actuator according to claim 1, wherein one or both of the following apply:
    (a) the polymeric material comprising silicon or nitrogen atoms that has two or more acrylate or vinyl end groups has two acrylate end groups; and
    (b) the polar polymeric material having two or more acrylate or vinyl end groups has two acrylate end groups.

4. The actuator according to claim 1, wherein the polymeric material comprising silicon or nitrogen atoms that has two or more acrylate or vinyl end groups has a number average molecular weight of greater than 20,000 Daltons.

5. The actuator according to claim 1, wherein the polar polymeric material having two or more acrylate or vinyl end groups is selected from one or more of poly (trimethylolpropane triacrylate-co-ethylene dimethacrylate), poly (ethyleneglycol) diacrylate (PEGDA), poly (caprolactone) dimethacrylate and poly (propylene glycol) dimethacrylate.

6. The actuator according to claim 1, wherein the polar polymeric material having two or more acrylate or vinyl end groups has a number average molecular weight of from 200 to 1,000 Daltons.

7. The actuator according to claim 1, wherein the polar polymeric material having two or more acrylate or vinyl end groups is present in the dielectric elastomeric material in an amount of from 5 to 15 wt %,.

8. The actuator according to claim 1, wherein one or more of the following apply:
    (aa) the dielectric elastomeric material has a dielectric constant (εr) of greater than 3; (ab) the dielectric elastomeric material has an elastic modulus of from 0.1 to 4 MPa; (ac) the buckling actuator has a displacement upon supply of a voltage to the first and second electrodes of less than or equal to 1,250 μm; (ad) the dielectric elastomeric material has a dielectric breakdown of less than or equal to 30 V/μm; and
    (ae) the dielectric elastomeric material has an elongation to break of greater than 50%.

9. The actuator according to claim 1, wherein the actuator further comprises a flexible substrate, where the second electrode is placed on the flexible substrate and the film of dielectric elastomeric material is formed on top of at least part of the second electrode and flexible substrate.

10. The actuator according to claim 1, wherein the actuator does not include rigid constraint members.

11. The actuator according to claim 1, wherein the first and second electrodes are independently selected from carbon grease, one or more metal nanowires, hydrogels, ionogels, carbon nanotubes and liquid metal.

12. An array of buckling actuators comprising a plurality of buckling actuators as described in claim 1.

13. A dielectric elastomeric material formed by the random block copolymerisation of:
    a polymeric material comprising silicon or nitrogen atoms that has two or more acrylate or vinyl end groups; and
    a polar polymeric material having two or more acrylate or vinyl end groups.

14. The dielectric elastomeric material according to claim 13, wherein one or both of the following apply:
    (ai) the polymeric material comprising silicon or nitrogen atoms that has two or more acrylate or vinyl end groups has two acrylate end groups; and
    (bii) the polar polymeric material having two or more acrylate or vinyl end groups has two acrylate end groups.

15. The dielectric elastomeric material according to claim 13, wherein the polymeric material comprising silicon or nitrogen atoms that has two or more acrylate or vinyl end groups has a number average molecular weight of greater than 20,000 Daltons.

16. The dielectric elastomeric material according to claim 13, wherein the polar polymeric material having two or more acrylate or vinyl end groups is selected from one or more of poly (trimethylolpropane triacrylate-co-ethylene dimethacrylate), poly (ethyleneglycol) diacrylate (PEGDA), poly (caprolactone) dimethacrylate and poly (propylene glycol) dimethacrylate.

17. The dielectric elastomeric material according claim 13, wherein the polar polymeric material having two or more acrylate or vinyl end groups has a number average molecular weight of from 200 to 1,000 Daltons.

18. The dielectric elastomeric material according to claim 13, wherein the polar polymeric material having two or more acrylate or vinyl end groups is present in the dielectric elastomeric material in an amount of from 5 to 15 wt %.

19. The dielectric elastomeric material according to claim 13, wherein one or more of the following apply:

(Aa) the dielectric elastomeric material has a dielectric constant ($\varepsilon r$) of greater than 3; (Ab) the dielectric elastomeric material has an elastic modulus of from 0.1 to 4 MPa; (Ac) the dielectric elastomeric material is provided in the form of a film;

(Ad) the dielectric elastomeric material has a dielectric breakdown of less than or equal to 30 V/$\mu$m; and (Ae) the dielectric elastomeric material has an elongation to break of greater than 50%.

20. A method of forming a dielectric elastomeric material as described in claim 13, the method comprising the steps of:
(i) providing a mixture comprising a polymeric material comprising silicon or nitrogen atoms that has two or more acrylate or vinyl end groups with a polar polymeric material having two or more acrylate or vinyl end groups in the presence of a radical initiator and optionally in the presence of a solvent; and
(ii) reacting the mixture for a period of time at an elevated temperature to provide the dielectric elastomeric material.

* * * * *